(12) United States Patent
Ikeda et al.

(10) Patent No.: US 11,985,881 B2
(45) Date of Patent: May 14, 2024

(54) DISPLAY PANEL, DISPLAY DEVICE, INPUT/OUTPUT DEVICE, DATA PROCESSING DEVICE

(71) Applicant: Semiconductor Energy Laboratory Co., Ltd., Kanagawa-ken (JP)

(72) Inventors: Hisao Ikeda, Kanagawa (JP); Fumito Isaka, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 712 days.

(21) Appl. No.: 17/254,753

(22) PCT Filed: Jun. 19, 2019

(86) PCT No.: PCT/IB2019/055128
§ 371 (c)(1),
(2) Date: Dec. 21, 2020

(87) PCT Pub. No.: WO2020/003056
PCT Pub. Date: Jan. 2, 2020

(65) Prior Publication Data
US 2021/0273023 A1   Sep. 2, 2021

(30) Foreign Application Priority Data
Jun. 29, 2018  (JP) .................................. 2018-123979

(51) Int. Cl.
*H10K 59/38* (2023.01)
*G06F 3/041* (2006.01)
(Continued)

(52) U.S. Cl.
CPC .......... *H10K 59/38* (2023.02); *G06F 3/0416* (2013.01); *G09G 3/32* (2013.01); *H10K 50/125* (2023.02);
(Continued)

(58) Field of Classification Search
CPC .......... G02B 5/22; G02B 5/201; G02B 30/27; G09G 3/32; G09G 3/3233; G09G 3/2074;
(Continued)

(56) References Cited

U.S. PATENT DOCUMENTS 5,554,911 A   9/1996  Nakayama et al.
5,652,600 A   7/1997  Khormaei et al.
(Continued)

FOREIGN PATENT DOCUMENTS

EP   0 616 488 A2   9/1994
JP   06-275381 A    9/1994
(Continued)

OTHER PUBLICATIONS

International Search Report (Application No. PCT/IB2019/055128) dated Oct. 1, 2019.
(Continued)

*Primary Examiner* — Mouloucoulaye Inoussa
(74) *Attorney, Agent, or Firm* — Husch Blackwell LLP

(57) ABSTRACT

A novel display panel that is highly convenient, useful, or reliable is provided. The display panel includes a display region and includes a first pixel, a second pixel, a third pixel, and a filter. The first pixel emits light with a spectrum having a local maximum at a first wavelength, the second pixel emits light with a spectrum having a local maximum at a second wavelength, and the third pixel emits light with a spectrum having a local maximum at a third wavelength. The filter includes a region overlapping with the first pixel, a region overlapping with the second pixel, and a region overlapping with the third pixel, and the filter has a transmittance spectrum having local minimums at a fourth wavelength and a fifth wavelength. The second wavelength is longer than the first wavelength. The third wavelength is longer than the second wavelength. The fourth wavelength
(Continued)

is between the first wavelength and the second wavelength. The fifth wavelength is between the second wavelength and the third wavelength.

10 Claims, 17 Drawing Sheets

(51) Int. Cl.
G09G 3/32 (2016.01)
H10K 50/125 (2023.01)
H10K 50/852 (2023.01)
H10K 59/131 (2023.01)
H10K 59/40 (2023.01)

(52) U.S. Cl.
CPC ......... H10K 50/852 (2023.02); H10K 59/131 (2023.02); H10K 59/40 (2023.02); G09G 2354/00 (2013.01)

(58) Field of Classification Search
CPC .. G09G 3/3275; H10K 50/852; H10K 59/131; H10K 59/40; H10K 50/125; H10K 59/38; H10K 59/30; H10K 59/123; H10K 59/35; H10K 50/865; H10K 59/12; H10K 50/80; H10K 59/352; H10K 50/818; H10K 50/171; H10K 50/16; H10K 50/13; H10K 59/351; H10K 50/17; H10K 50/19; H10K 50/8426; G09F 9/30; G06F 3/0416; G06F 3/04144; H05B 33/12; H05B 33/22; H05B 33/10; H05B 33/04; H05B 33/14; H01L 27/1225; H01L 33/405; H01L 33/44
USPC ............. 257/89, 40, 98, 72, 33.068, 51.022; 438/29, 35; 313/504, 506; 445/23; 362/231, 293
See application file for complete search history.

(56) References Cited

U.S. PATENT DOCUMENTS

| | | | |
|---|---|---|---|
| 6,737,800 B1 | 5/2004 | Winters et al. | |
| 7,531,847 B2 | 5/2009 | Shitagaki et al. | |
| 8,017,422 B2 | 9/2011 | Fujii et al. | |
| 8,389,988 B2 | 3/2013 | Yamazaki et al. | |
| 8,501,843 B2 | 8/2013 | Ishida et al. | |
| 8,569,948 B2 | 10/2013 | Wolk et al. | |
| 8,633,473 B2 | 1/2014 | Noda et al. | |
| 9,153,627 B2 | 10/2015 | Ohsawa et al. | |
| 9,231,154 B2 | 1/2016 | Ikeda et al. | |
| 9,918,370 B2 | 3/2018 | Wolk et al. | |
| 2003/0107314 A1* | 6/2003 | Urabe | H10K 50/865 313/506 |
| 2005/0249972 A1 | 11/2005 | Hatwar et al. | |
| 2006/0138945 A1 | 6/2006 | Wolk et al. | |
| 2007/0015429 A1* | 1/2007 | Maeda | H10K 50/852 313/506 |
| 2007/0194679 A1 | 8/2007 | Jo et al. | |
| 2007/0210703 A1 | 9/2007 | Izzanni et al. | |
| 2008/0125524 A1 | 5/2008 | Ishida et al. | |
| 2010/0090595 A1 | 4/2010 | Nomura et al. | |
| 2010/0117999 A1 | 5/2010 | Matsunaga et al. | |
| 2011/0095276 A1* | 4/2011 | Imai | H10K 59/38 257/89 |
| 2011/0228510 A1 | 9/2011 | Park et al. | |
| 2012/0038267 A1* | 2/2012 | Hanamura | H10K 59/38 313/504 |
| 2012/0168787 A1* | 7/2012 | Okumoto | H10K 59/35 257/89 |
| 2013/0009194 A1 | 1/2013 | Yamazaki et al. | |
| 2014/0284642 A1 | 9/2014 | Yamazaki et al. | |
| 2014/0306201 A1* | 10/2014 | Yamazaki | H10K 59/122 257/40 |
| 2014/0334143 A1 | 11/2014 | Ishitani et al. | |
| 2015/0236074 A1* | 8/2015 | Akagawa | G02B 5/201 257/40 |
| 2015/0346776 A1* | 12/2015 | Miyake | G06F 3/0202 345/174 |
| 2016/0062512 A1* | 3/2016 | Ishizaki | G06F 3/0446 29/830 |
| 2016/0070314 A1* | 3/2016 | Takahashi | G02F 1/1345 361/679.21 |
| 2016/0118626 A1* | 4/2016 | Seo | H10K 59/351 257/89 |
| 2016/0126500 A1* | 5/2016 | Uesaka | H10K 50/131 257/89 |
| 2016/0233284 A1* | 8/2016 | Hanamura | H10K 50/865 |
| 2017/0104035 A1* | 4/2017 | Lee | H10K 59/38 |
| 2017/0176814 A1* | 6/2017 | Sasaki | G02F 1/133553 |
| 2017/0205925 A1* | 7/2017 | Yamazaki | G02F 1/1368 |
| 2017/0236880 A1* | 8/2017 | Kubota | G02B 5/201 257/40 |
| 2017/0271414 A1 | 9/2017 | Ohsawa et al. | |
| 2017/0301699 A1* | 10/2017 | Yamazaki | H01L 29/78696 |
| 2017/0331065 A1* | 11/2017 | Seo | H10K 85/351 |
| 2017/0338289 A1* | 11/2017 | Seo | H10K 50/86 |
| 2017/0363916 A1* | 12/2017 | Koo | G02F 1/1368 |
| 2018/0018054 A1* | 1/2018 | Kimura | G06F 3/0445 |
| 2019/0140148 A1* | 5/2019 | Yoshimura | C09K 11/617 |
| 2019/0378873 A1* | 12/2019 | Lee | H01L 25/0655 |
| 2020/0133414 A1* | 4/2020 | Lee | G06F 3/044 |
| 2020/0135093 A1* | 4/2020 | Prathaban | G09G 3/32 |

FOREIGN PATENT DOCUMENTS

| | | |
|---|---|---|
| JP | 2014-239032 A | 12/2014 |
| JP | 2015-026561 A | 2/2015 |
| KR | 10-0768238 B1 | 10/2007 |

OTHER PUBLICATIONS

Written Opinion (Application No. PCT/IB2019/055128) dated Oct. 1, 2019.

* cited by examiner

DISPLAY PANEL, DISPLAY DEVICE, INPUT/OUTPUT DEVICE, DATA PROCESSING DEVICE

This application is a 371 of international application PCT/IB2019/055128 filed on Jun. 19, 2019 which is incorporated herein by reference.

TECHNICAL FIELD

One embodiment of the present invention relates to a display panel, a display device, an input/output device, a data processing device, or a semiconductor device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Thus, more specifically, examples of the technical field of one embodiment of the present invention disclosed in this specification include a semiconductor device, a display device, a light-emitting device, a power storage device, a memory device, a driving method thereof, and a manufacturing method thereof.

BACKGROUND ART

A light-emitting device which includes an absorption layer, a conductive film overlapping with the absorption layer, and a light-emitting module electrically connected to the conductive film and in which the conductive film reflects visible light, the light-emitting module emits light with a spectrum having a local maximum at one wavelength in a visible light region to the absorption layer, and the absorption layer absorbs part of light having a shorter wavelength than the one wavelength and part of light having a longer wavelength than the one wavelength more than light having the one wavelength is known (Patent Document 1).

REFERENCE

Patent Document

[Patent Document 1] Japanese Published Patent Application No. 2014-239032

SUMMARY OF THE INVENTION

Problems to be Solved by the Invention

An object of one embodiment of the present invention is to provide a novel display panel that is highly convenient, useful, or reliable. Another object is to provide a novel display device that is highly convenient, useful, or reliable. Another object is to provide a novel input/output device that is highly convenient, useful, or reliable. Another object is to provide a novel data processing device that is highly convenient, useful, or reliable. Another object is to provide a novel display panel, a novel display device, a novel input/output device, a novel data processing device, or a novel semiconductor device.

Note that the description of these objects does not preclude the existence of other objects. One embodiment of the present invention does not have to achieve all these objects. Other objects are apparent from and can be derived from the description of the specification, the drawings, the claims, and the like.

Means for Solving the Problems (1) One embodiment of the present invention is a display panel including a display region.

The display region includes a first pixel, a second pixel, a third pixel, and a filter.

The first pixel emits light with a spectrum having a local maximum at a first wavelength $\lambda(1)$.

The second pixel emits light with a spectrum having a local maximum at a second wavelength $\lambda(2)$.

The third pixel emits light with a spectrum having a local maximum at a third wavelength $\lambda(3)$.

The filter includes a region overlapping with the first pixel, a region overlapping with the second pixel, and a region overlapping with the third pixel.

The filter has a transmittance spectrum having local minimums at a fourth wavelength $\lambda(4)$ and a fifth wavelength $\lambda(5)$.

The second wavelength $\lambda(2)$ is longer than the first wavelength $\lambda(1)$, and the third wavelength $\lambda(3)$ is longer than the second wavelength $\lambda(2)$.

The fourth wavelength $\lambda(4)$ is between the first wavelength $\lambda(1)$ and the second wavelength $\lambda(2)$, and the fifth wavelength $\lambda(5)$ is between the second wavelength $\lambda(2)$ and the third wavelength $\lambda(3)$.

Thus, the width of the spectrum having a local maximum at the wavelength $\lambda(1)$ can be narrowed. The width of the spectrum having a local maximum at the wavelength $\lambda(2)$ can be narrowed. The width of the spectrum having a local maximum at the wavelength $\lambda(3)$ can be narrowed. The tail of the spectrum having a local maximum at the wavelength $\lambda(1)$ can be cut. The tail of the spectrum having a local maximum at the wavelength $\lambda(2)$ can be cut. The tail of the spectrum having a local maximum at the wavelength $\lambda(3)$ can be cut. A color displayed by the pixel can be made vivid. As a result, a novel display panel that is highly convenient, useful, or reliable can be provided.

(2) Another embodiment of the present invention is the above display panel in which the filter has a transmittance lower than or equal to 0.5 in a wavelength band having a width of 20 nm or preferably 30 nm including the fourth wavelength $\lambda(4)$ and the filter has a transmittance lower than or equal to 0.5 in a wavelength band having a width of 30 nm or preferably 40 nm including the fifth wavelength $\lambda(5)$. The filter includes a multilayer film.

Thus, the change in transmittance with respect to a wavelength of light can be made steep. The structure of the filter does not need to be changed for each of the pixels displaying different colors. A color of light emitted from the pixel can be made vivid. As a result, a novel display panel that is highly convenient, useful, or reliable can be provided.

(3) Another embodiment of the present invention is the above display panel in which the first pixel has a microcavity structure and includes a light-emitting element.

The microcavity structure includes a first reflective film and a second reflective film.

The second reflective film includes a region overlapping with the first reflective film.

The light-emitting element includes a layer containing a light-emitting material, a first electrode, and a second electrode.

The layer containing a light-emitting material includes a region positioned between the first electrode and the second electrode.

The layer containing a light-emitting material includes a region positioned between the first reflective film and the second reflective film.

(4) Another embodiment of the present invention is the above display panel in which the second pixel includes the layer containing a light-emitting material and a first adjustment layer, and the third pixel includes the layer containing a light-emitting material and a second adjustment layer.

The second adjustment layer has a longer optical distance than the first adjustment layer.

Thus, the adjustment layer can be formed by a photolithography process. The structure of the layer containing a light-emitting material does not need to be changed for each of the pixels displaying different colors. A layer containing a light-emitting material can be used for the pixel. As a result, a novel display panel that is highly convenient, useful, or reliable can be provided.

(5) Another embodiment of the present invention is the above display panel in which the display region includes a group of pixels, a different group of pixels, a scan line, and a signal line.

The group of pixels is arranged in a row direction and the group of pixels includes the first pixel.

The different group of pixels are arranged in a column direction intersecting the row direction.

The different group of pixels includes the first pixel.

The scan line is electrically connected to the group of pixels.

The signal line is electrically connected to the different group of pixels.

Thus, image data can be supplied to a plurality of pixels. As a result, a novel display panel that is highly convenient, useful, or reliable can be provided.

(6) Another embodiment of the present invention is the above display panel in which the display region includes 2000 or more pixels per inch, preferably 3000 or more pixels, and the pixels includes the first pixel.

Thus, without changing the structure of the layer 553 containing a light-emitting material for each of the pixels displaying different colors, a high-definition pixel can be formed by a photolithography process. A high-definition image can be displayed. As a result, a novel display panel that is highly convenient, useful, or reliable can be provided.

(7) Another embodiment of the present invention is a display device including the above display panel and a control portion.

The control portion is supplied with image data and control data, the control portion generates data on the basis of the image data, the control portion generates a control signal on the basis of the control data, and the control portion supplies the data and the control signal.

The display panel is supplied with the data and the control signal. The pixel performs display on the basis of the data.

Thus, the image data can be displayed using a display element. As a result, a novel display device that is highly convenient, useful, or reliable can be provided.

(8) Another embodiment of the present invention is an input/output device including an input portion and a display portion.

The display portion includes the above display panel.

The input portion includes a sensing region, the input portion senses an object approaching the sensing region, and the sensing region includes a region overlapping with the first pixel.

Thus, the object approaching the region overlapping with the display portion can be sensed while image data is displayed by the display portion. Alternatively, a finger or the like that approaches the display portion can be used as a pointer to input positional data. Alternatively, positional data can be associated with image data displayed on the display portion. As a result, a novel input/output device that is highly convenient, useful, or reliable can be provided.

(9) Another embodiment of the present invention is a data processing device including an arithmetic device and an input/output device.

The arithmetic device is supplied with input data or sensing data, the arithmetic device generates control data and image data on the basis of the input data or the sensing data, and the arithmetic device supplies the control data and the image data.

The input/output device supplies the input data and the sensing data, the input/output device is supplied with the control data and the image data, and the input/output device includes a display portion, an input portion, and a sensing portion.

The display portion includes the above display panel, and the display portion displays the image data on the basis of the control data.

The input portion generates the input data, and the sensing portion generates the sensing data.

Thus, the control data can be generated on the basis of the input data or the sensing data. Alternatively, the image data can be displayed on the basis of the input data or the sensing data. As a result, a novel data processing device that is highly convenient, useful, or reliable can be provided.

(10) Another embodiment of the present invention is a data processing device including one or more of a keyboard, a hardware button, a pointing device, a touch sensor, an illuminance sensor, an imaging device, an audio input device, an eye-gaze input device, and an attitude detection device, and the above display panel.

Thus, an arithmetic device can generate image data or control data on the basis of data supplied using a variety of input devices. As a result, a novel data processing device that is highly convenient, useful, or reliable can be provided.

Although the block diagram in which components are classified by their functions and shown as independent blocks is shown in the drawings attached to this specification, it is difficult to completely divide actual components according to their functions and one component can relate to a plurality of functions.

In this specification, the names of a source and a drain of a transistor interchange with each other depending on the polarity of the transistor and the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, for the sake of convenience, the connection relation of a transistor is sometimes described assuming that the source and the drain are fixed; in reality, the names of the source and the drain interchange with each other according to the above relation of the potentials.

In this specification, a source of a transistor means a source region that is part of a semiconductor film functioning as an active layer or a source electrode connected to the above-described semiconductor film. Similarly, a drain of a transistor means a drain region that is part of the above-described semiconductor film or a drain electrode connected to the semiconductor film. Moreover, a gate means a gate electrode.

In this specification, a state in which transistors are connected in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

In this specification, connection means electrical connection and corresponds to a state in which a current, a voltage, or a potential can be supplied or transmitted. Accordingly, a state of being connected does not necessarily mean a state of being directly connected and also includes, in its category, a state of being indirectly connected through a circuit element such as a wiring, a resistor, a diode, or a transistor that allows a current, a voltage, or a potential to be supplied or transmitted.

In this specification, even when independent components are connected to each other in a circuit diagram, there is actually a case where one conductive film has functions of a plurality of components such as a case where part of a wiring functions as an electrode, for example. Connection in this specification also includes such a case where one conductive film has functions of a plurality of components, in its category.

Furthermore, in this specification, one of a first electrode and a second electrode of a transistor refers to a source electrode and the other refers to a drain electrode.

Effect of the Invention

According to one embodiment of the present invention, a novel display panel that is highly convenient, useful, or reliable can be provided. A novel display panel or a novel semiconductor device can be provided.

Note that the descriptions of the effects do not disturb the existence of other effects. Note that one embodiment of the present invention does not need to have all these effects. Other effects will be apparent from the description of the specification, the drawings, the claims, and the like, and other effects can be derived from the description of the specification, the drawings, the claims, and the like.

MODE FOR CARRYING OUT THE INVENTION

Figure 1A:
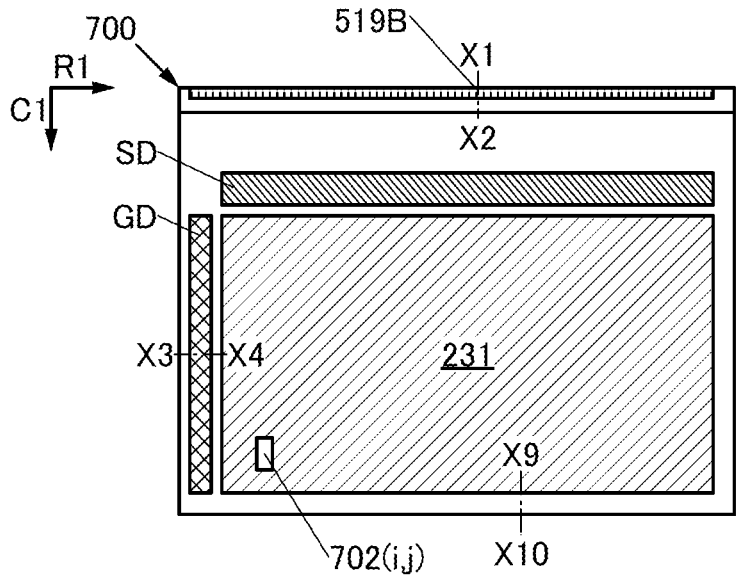
FIG. 1 (A) to (E) Diagrams illustrating structures of a display panel of an embodiment.

A display panel of one embodiment of the present invention includes a display region. The display region includes a first pixel, a second pixel, a third pixel, and a filter. The first pixel emits light with a spectrum having a local maximum at a first wavelength. The second pixel emits light with a spectrum having a local maximum at a second wavelength. The third pixel emits light with a spectrum having a local maximum at a third wavelength. The filter includes a region overlapping with the first pixel, a region overlapping with the second pixel, and a region overlapping with the third pixel, and the filter has a transmittance spectrum having local minimums at a fourth wavelength and a fifth wavelength. The second wavelength is longer than the first wavelength. The third wavelength is longer than the second wavelength. The fourth wavelength is between the first wavelength and the second wavelength. The fifth wavelength is between the second wavelength and the third wavelength.

Thus, the width of a spectrum of light emitted from the first pixel can be made narrow. The width of a spectrum of light emitted from the second pixel can be made narrow. The width of a spectrum of light emitted from the third pixel can be made narrow. A color of light emitted from the first pixel can be made vivid. A color of light emitted from the second pixel can be made vivid. A color of light emitted from the third pixel can be made vivid. As a result, a novel display panel that is highly convenient, useful, or reliable can be provided.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the descriptions in the following embodiments. Note that in structures of the present invention described below, the same portions or portions having similar functions are denoted by the same reference numerals in different drawings, and a description thereof is not repeated.

Embodiment 1

In this embodiment, a structure of a display panel of one embodiment of the present invention will be described with reference to FIG. 1 to FIG. 4.

FIG. 1 is a diagram illustrating the structure of the display panel of one embodiment of the present invention. FIG. 1(A) is a top view of the display panel of one embodiment of the present invention, and FIG. 1(B) illustrates part of FIG. 1(A).

Figure 2A:
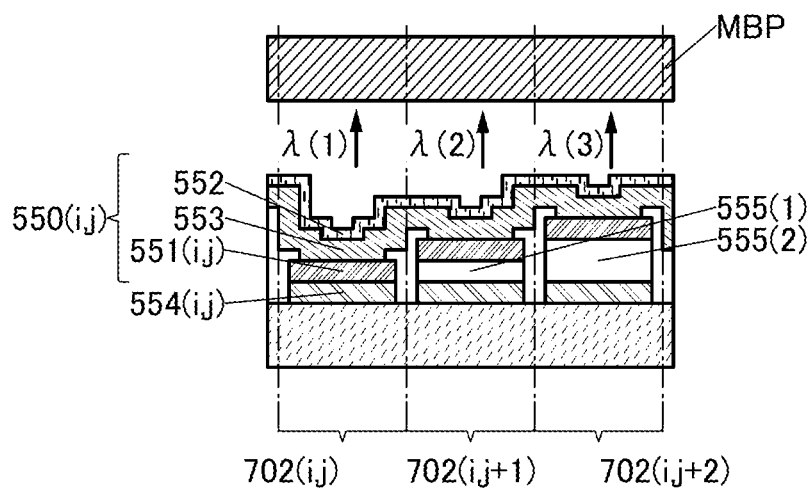
FIGS. 2 (A) and (B) Diagrams illustrating a structure of a display panel of an embodiment.
Figure 2B:
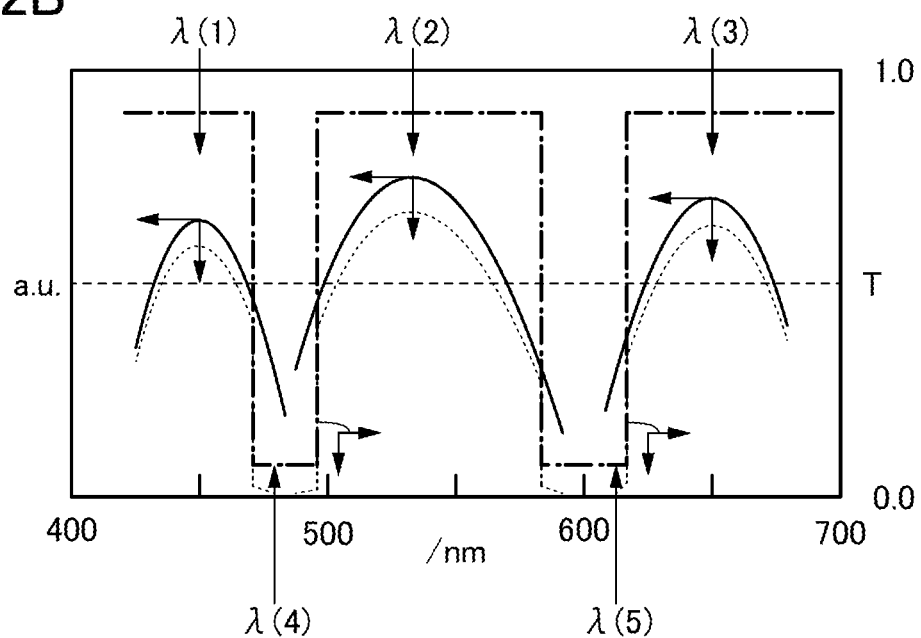

FIG. 2 is a diagram illustrating the structure of the display panel of one embodiment of the present invention. FIG. 2(A) is a cross-sectional view of the display panel of one embodiment of the present invention, and FIG. 2(B) is a graph showing spectra of light emitted from pixels of the display panel and transmittance spectra of a filter.

Figure 3A:
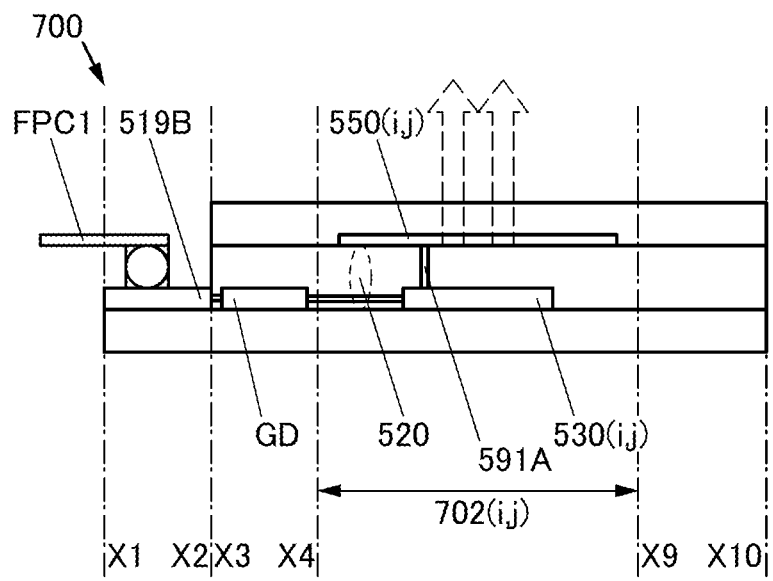
FIGS. 3 (A) and (B) Diagrams illustrating a structure of a display panel of an embodiment.
Figure 3B:
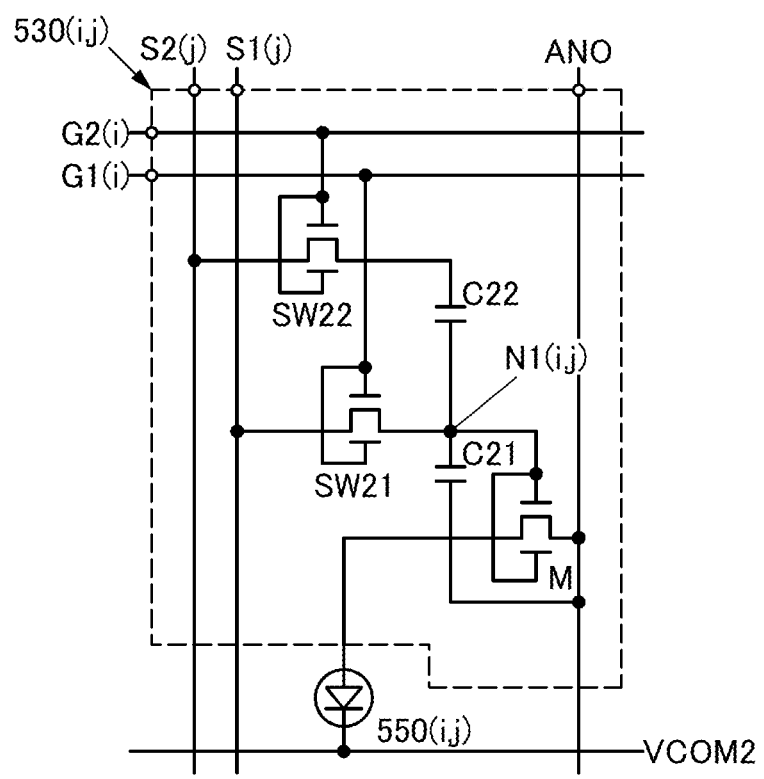

FIG. 3 is a diagram illustrating the structure of the display panel of one embodiment of the present invention. FIG. 3(A) is a cross-sectional view taken along cutting lines X1-X2, X3-X4, and X9-X10 in FIG. 1(A) and in a pixel, and FIG. 3(B) is a circuit diagram illustrating a structure of a pixel circuit 530$(i,j)$.

Figure 4A:
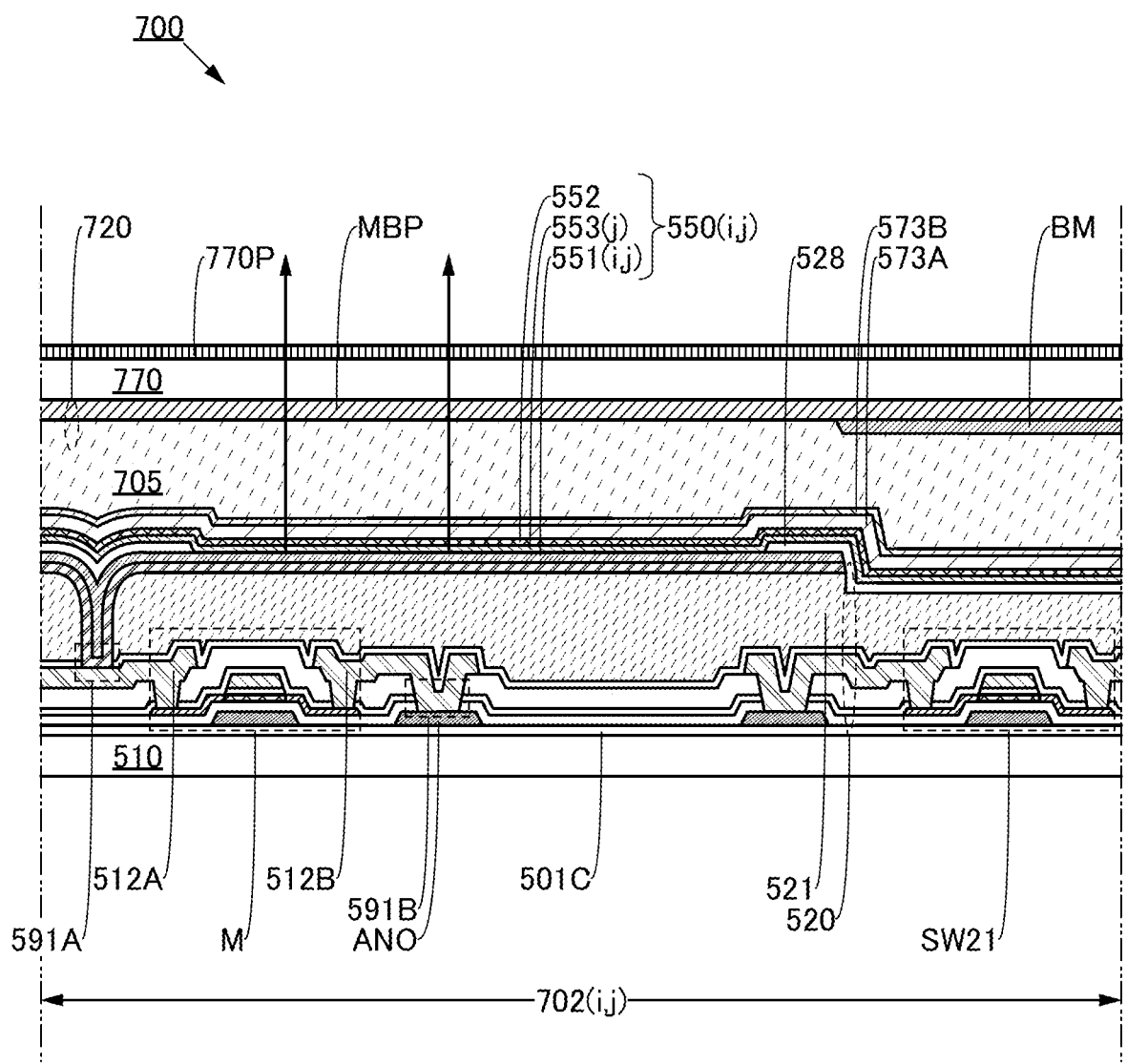
FIGS. 4 (A) and (B) Cross-sectional views illustrating a structure of a display panel of an embodiment.
Figure 4B:
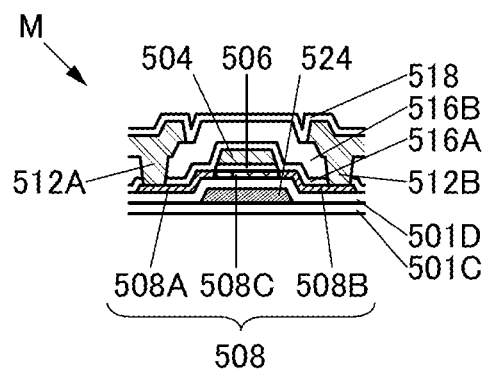

FIG. 4 is a diagram illustrating the structure of the display panel of one embodiment of the present invention. FIG. 4(A) is a cross-sectional view of a pixel 702$(i,j)$ in FIG. 1(A), and FIG. 4(B) is a cross-sectional view illustrating part of FIG. 4(A).

Figure 5A:
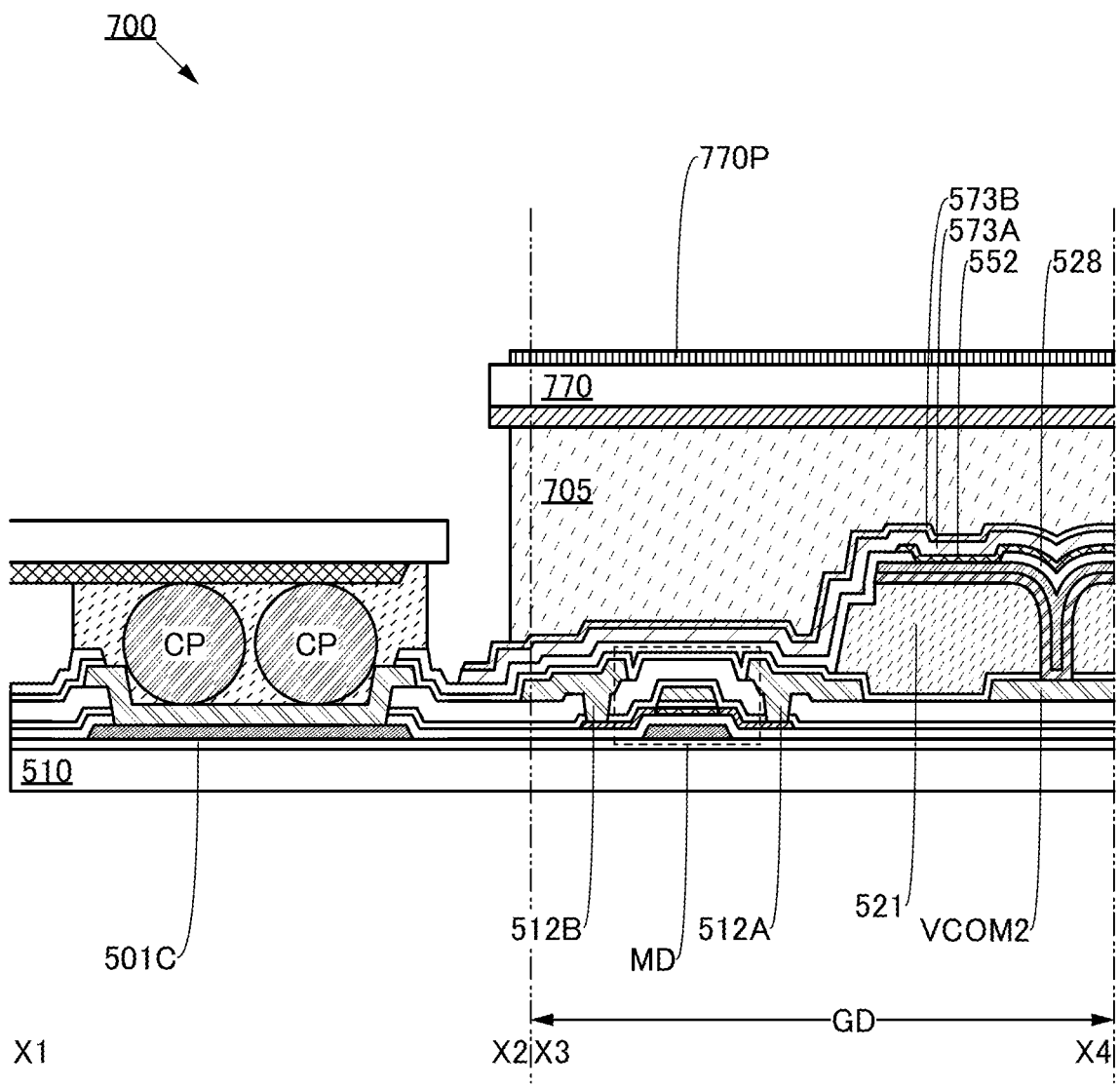
FIGS. 5 (A) and (B) Cross-sectional views illustrating a structure of a display panel of an embodiment.
Figure 5B:
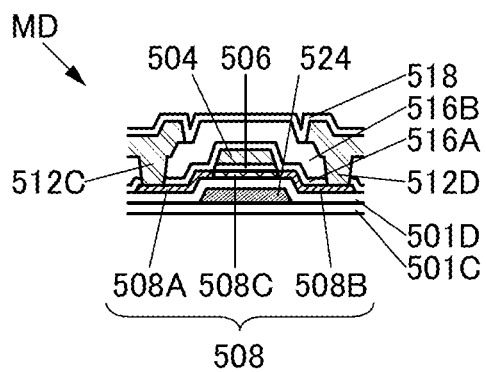

FIG. 5 is a diagram illustrating a structure of the display panel of one embodiment of the present invention. FIG. 5(A) is a cross-sectional view taken along cutting plane lines X1-X2 and X3-X4 in FIG. 1(A), and FIG. 5(B) is a cross-sectional view illustrating part of FIG. 5(A).

Figure 6A:
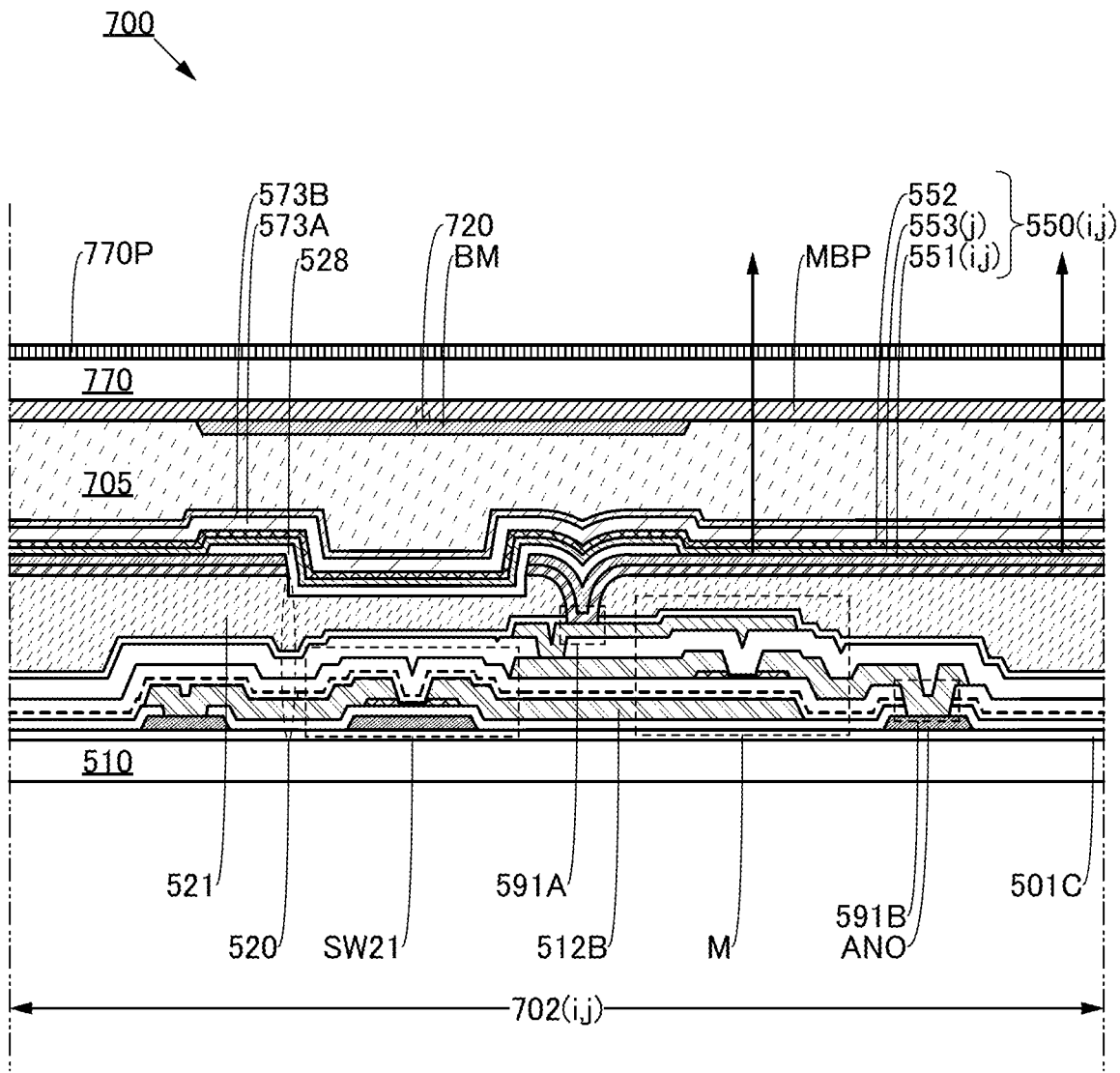
FIG. 6 (A) to (C) Cross-sectional views illustrating a structure of a display panel of an embodiment.
Figure 6B:
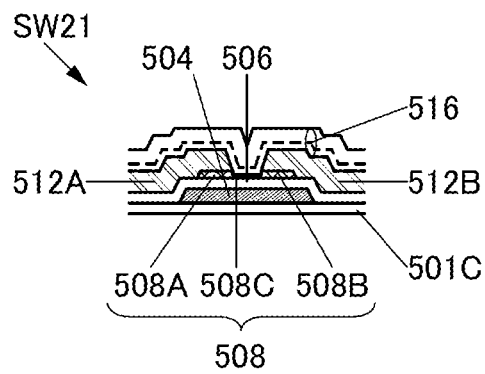
Figure 6C:
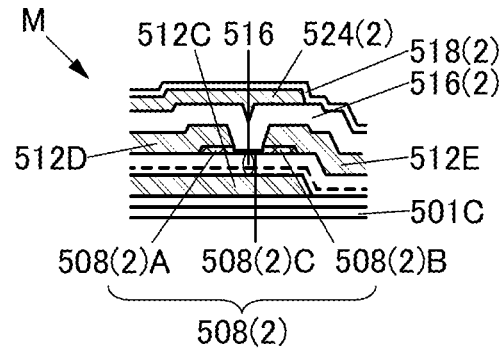

FIG. 6 is a diagram illustrating a structure of the display panel of one embodiment of the present invention. FIG. 6(A) is a cross-sectional view of the pixel 702$(i,j)$ having a structure different from the structure illustrated in FIG. 4(A), and FIG. 6(B) and FIG. 6(C) are cross-sectional views illustrating part of FIG. 6(A).

Note that in this specification, an integer variable of 1 or more is sometimes used in reference numerals. For example, (p) where p is an integer variable of 1 or more is sometimes used in part of a reference numeral that specifies any of p components at a maximum. For another example, (m,n) where m and n are each an integer variable of 1 or more is sometimes used in part of a reference numeral that specifies any of m×n components at a maximum.

<Structure Example 1 of Display Panel 700>

The display panel 700 described in this embodiment includes a display region 231 (see FIG. 1(A)).

<<Structure Example 1 of Display Region 231>>

Figure 1B:
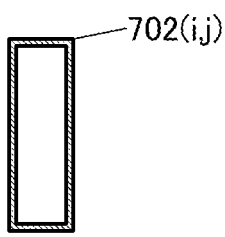

The display region 231 includes the pixel 702$(i,j)$, the pixel 702$(i,j+1)$, the pixel 702$(i,j+2)$, and a filter MBP (see FIG. 1(B) and FIG. 2(A)).

The pixel 702$(i,j)$ emits light with a spectrum having a local maximum at a wavelength $\lambda(1)$ (see FIG. 2(B)). For example, blue light with a spectrum having a local maximum at the wavelength $\lambda(1)$ is emitted. Note that emission spectra are schematically shown by solid lines using an arbitrary unit on a left vertical axis.

The pixel 702$(i,j+1)$ emits light with a spectrum having a local maximum at a wavelength $\lambda(2)$. For example, green light with a spectrum having a local maximum at the wavelength $\lambda(2)$ is emitted.

The pixel 702$(i,j+2)$ emits light with a spectrum having a local maximum at a wavelength $\lambda(3)$. For example, red light with a spectrum having a local maximum at the wavelength $\lambda(3)$ is emitted.

<<Structure Example 1 of Filter MBP>>

The filter MBP includes a region overlapping with the pixel 702$(i,j)$, a region overlapping with the pixel 702$(i,j+1)$, and a region overlapping with the pixel 702$(i,j+2)$.

The filter MBP has a transmittance spectrum having local minimums at a wavelength $\lambda(4)$ and a wavelength $\lambda(5)$ (see FIG. 2(B)). Note that transmittance spectra are schematically shown by dashed-dotted lines using a transmittance on a right vertical axis.

The wavelength $\lambda(2)$ is longer than the wavelength $\lambda(1)$, and the wavelength $\lambda(3)$ is longer than the wavelength $\lambda(2)$.

The wavelength $\lambda(4)$ is between the wavelength $\lambda(1)$ and the wavelength $\lambda(2)$, and the wavelength $\lambda(5)$ is between the wavelength $\lambda(2)$ and the wavelength $\lambda(3)$.

For example, a multi-band pass filter can be used as the filter MBP. Alternatively, a multi-notch filter can be used as the filter MBP. Note that spectra of light transmitted through the filter MBP are schematically shown by dotted lines using the arbitrary unit on the left vertical axis.

Thus, the width of the spectrum having a local maximum at the wavelength $\lambda(1)$ can be narrowed. Alternatively, the width of the spectrum having a local maximum at the wavelength $\lambda(2)$ can be narrowed. Alternatively, the width of the spectrum having a local maximum at the wavelength $\lambda(3)$ can be narrowed. Alternatively, the tail of the spectrum having a local maximum at the wavelength $\lambda(1)$ can be cut. Alternatively, the tail of the spectrum having a local maximum at the wavelength $\lambda(2)$ can be cut. Alternatively, the tail of the spectrum having a local maximum at the wavelength $\lambda(3)$ can be cut. Alternatively, colors displayed by the pixel 702$(i,j)$ to the pixel 702$(i,j+2)$ can be made vivid. As a result, a novel display panel that is highly convenient, useful, or reliable can be provided. Note that blue light from which greenish light is removed becomes vivid, for example (see FIG. 2(B)). Green light from which bluish light and reddish light are removed becomes vivid. Red light from which greenish light is removed becomes vivid.

<<Structure Example 2 of Filter MBP>>

The filter MBP has a transmittance lower than or equal to 0.5, preferably a transmittance lower than or equal to 0.1, further preferably a transmittance lower than or equal to 0.01, in a wavelength band having a width of 20 nm or preferably 30 nm including the wavelength $\lambda(4)$. Furthermore, the filter MBP has a transmittance lower than or equal to 0.5 in a wavelength band having a width of 30 nm or preferably 40 nm including the wavelength $\lambda(5)$. Note that the filter MBP has a transmittance higher than or equal to 0.85, preferably a transmittance higher than or equal to 0.9, further preferably a transmittance higher than or equal to 0.95 in the wavelength $\lambda(1)$, the wavelength $\lambda(2)$, and the wavelength $\lambda(3)$.

Specifically, a filter including a stacked-layer film in which a low refractive layer and a high refractive layer are alternately stacked can be used as the filter MBP. For example, a filter whose transmittance transits from a transmission band higher than or equal to 0.8 to a non-transmission band lower than or equal to 0.1 within 10 nm can be used as the filter MBP.

Thus, the change in transmittance with respect to a wavelength of light can be made steep. The structure of the filter MBP does not need to be changed for each of the pixels displaying different colors. As a result, a novel display panel that is highly convenient, useful, or reliable can be provided.

<<Structure Example of Pixel 702$(i,j)$>>

The pixel 702$(i,j)$ has a microcavity structure and includes a light-emitting element 550$(i,j)$.

The microcavity structure includes one reflective film 554$(i,j)$ and the other reflective film. For example, an electrode 552 can be used as the other reflective film.

The other reflective film includes a region overlapping with the one reflective film 554$(i,j)$. Furthermore, the one reflective film 554(i,j) and the other reflective film reflect light and at least one of the one reflective film 554(i,j) and the other reflective film transmits part of light.

The light-emitting element 550(i,j) includes a layer 553 containing a light-emitting material, an electrode 551(i,j), and the electrode 552.

The layer 553 containing a light-emitting material includes a region positioned between the electrode 551(i,j) and the electrode 552.

The layer 553 containing a light-emitting material includes a region positioned between the reflective film 554(i,j) and the electrode 552.

<<Structure Example of Pixel 702(i,j+1)>>

The pixel 702(i,j+1) includes the layer 553 containing a light-emitting material and an adjustment layer 555(1).

<<Structure Example of Pixel 702(i,j+2)>>

The pixel 702(i,j+2) includes the layer 553 containing a light-emitting material and an adjustment layer 555(2).

The adjustment layer 555(2) has a longer optical distance than the adjustment layer 555(1).

This allows the adjustment layer 555(1) and the adjustment layer 555(2) to be formed by a photolithography process. The structure of the layer 553 containing a light-emitting material does not need to be changed for each of the pixels displaying different colors. The layer 553 containing a light-emitting material can be used for the pixel 702(i,j) to the pixel 702(i,j+2). As a result, a novel display panel that is highly convenient, useful, or reliable can be provided.

<Structure Example 2 of Display Panel 700>

The display panel 700 described in this embodiment includes a functional layer 520 (see FIG. 3(A)).

<<Structure Example of Pixel 702(i,j)>>

The pixel 702(i, j) includes the display element 550(i,j) and the pixel circuit 530(i,j).

<<Structure Example 1 of Functional Layer 520>>

The functional layer 520 includes the pixel circuit 530(i, j). The functional layer 520 has an opening portion 591A.

The pixel circuit 530(i,j) is electrically connected to the display element 550(i,j) in the opening portion 591A.

Accordingly, the pixel circuit 530(i,j) can be formed in the functional layer 520. The display element 550(i,j) can be driven using the pixel circuit 530(i,j). As a result, a novel display panel that is highly convenient, useful, or reliable can be provided.

<<Structure Example 1 of Pixel Circuit 530(i,j)>>

The pixel circuit 530(i,j) is electrically connected to a scan line G1(i) and a signal line S1(j) (see FIG. 3(B)).

A switch, a transistor, a diode, a resistor, an inductor, a capacitor, or the like can be used in the pixel circuit 530(i,j), for example. Specifically, a transistor can be used as the switch.

For example, in the case where a plurality of transistors are used in the pixel circuit, in a step of forming a semiconductor film of a transistor, a semiconductor film of a different transistor can be formed.

<<Structure Example 2 of Pixel Circuit 530(i,j)>>

The pixel circuit 530(i,j) includes a transistor M, a capacitor C21, a switch SW21, and a node N1(i,j) (see FIG. 3(B)).

The transistor M includes a first electrode electrically connected to a conductive film ANO and a second electrode electrically connected to the display element 550(i,j).

The capacitor C21 includes a first electrode electrically connected to a gate electrode of the transistor M and a second electrode electrically connected to the conductive film ANO.

The switch SW21 includes a first terminal supplied with a first signal and a second terminal electrically connected to the gate electrode of the transistor M. Note that the switch SW21 has a function of switching a conducting state or a non-conducting state on the basis of a selection signal.

The display element 550(i,j) performs display on the basis of a potential VN of the node N1(i,j).

<<Structure Example 3 of Pixel Circuit 530(i,j)>>

The pixel circuit 530(i,j) includes the transistor M, the capacitor C21, the switch SW21, the node N1(i,j), a capacitor C22, and a switch SW22 (see FIG. 3(B)).

The transistor M includes the first electrode electrically connected to the conductive film ANO and the second electrode electrically connected to the display element 550(i,j).

The capacitor C21 includes the first electrode electrically connected to the gate electrode of the transistor M and the second electrode electrically connected to the conductive film ANO.

The switch SW21 includes the first terminal supplied with the first signal and the second terminal electrically connected to the gate electrode of the transistor M. Note that the switch SW21 has a function of switching a conducting state or a non-conducting state on the basis of a selection signal.

The capacitor C22 includes a first electrode electrically connected to the gate electrode of the transistor M, and the capacitor C22 includes a second electrode electrically connected to the switch SW22.

The switch SW22 includes a first terminal supplied with a second signal. Note that the switch SW22 has a function of switching a conducting state or a non-conducting state on the basis of a second selection signal.

The switch SW22 is in a conducting state when the switch SW21 is changed from a conducting state to a non-conducting state, the switch SW22 has a function of changing from a non-conducting state to a conducting state when the switch SW21 is in a non-conducting state, and the switch SW22 has a function of changing from a conducting state to a non-conducting state when the switch SW21 is in a non-conducting state.

The display element 550(i,j) performs display on the basis of the potential VN of the node N1(i, j).

Thus, the potential of the node N1(i,j) can be controlled using the switch SW21 and the switch SW22. Alternatively, the potential of the node N1(i,j) can be controlled using the switch SW21, and the potential of the node N1(i,j) can be changed using the switch SW22. Alternatively, the changing potential can be supplied to the display element 550(i,j). Alternatively, display can be performed in accordance with the changing potential. Alternatively, the display of the display element 550(i,j) can be changed. Alternatively, an operation of the display element 550(i,j) can be emphasized. Alternatively, the response of the display element 550(i,j) can be made faster. As a result, a novel display panel that is highly convenient, useful, or reliable can be provided.

<<Structure Example of Transistor>>

A bottom-gate transistor or a top-gate transistor can be used in the pixel circuit 530(i,j), for example.

The transistor includes a semiconductor film 508, a conductive film 504, a conductive film 512A, and a conductive film 512B (see FIG. 4(B)).

The semiconductor film 508 includes a region 508A electrically connected to the conductive film 512A and a region 508B electrically connected to the conductive film 512B. The semiconductor film 508 includes a region 508C between the region 508A and the region 508B.

The conductive film 504 includes a region overlapping with the region 508C, and the conductive film 504 has a function of a gate electrode.

An insulating film 506 includes a region positioned between the semiconductor film 508 and the conductive film 504. The insulating film 506 has a function of a gate insulating film.

The conductive film 512A has one of a function of a source electrode and a function of a drain electrode, and the conductive film 512B has the other of the function of the source electrode and the function of the drain electrode.

A conductive film 524 can be used for the transistor. The semiconductor film 508 is positioned between the conductive film 504 and a region included in the conductive film 524. The conductive film 524 has a function of a second gate electrode. The conductive film 524 can be electrically connected to the conductive film 504, for example. Note that a conductive film that can be formed in a step of forming the conductive film 524 can be used for the scan line G1(i).

Note that in a step of forming the semiconductor film used in the transistor of the pixel circuit, a semiconductor film used in a transistor of a driver circuit can be formed.

<<Structure Example 1 of Semiconductor Film 508>>

A semiconductor containing a Group 14 element can be used for the semiconductor film 508, for example. Specifically, a semiconductor containing silicon can be used for the semiconductor film 508.

[Hydrogenated Amorphous Silicon]

For example, hydrogenated amorphous silicon can be used for the semiconductor film 508. Alternatively, microcrystalline silicon or the like can be used for the semiconductor film 508. Thus, a display panel having less display unevenness than a display panel that uses polysilicon for the semiconductor film 508, for example, can be provided. Alternatively, the size of the display panel can be easily increased.

[Polysilicon]

For example, polysilicon can be used for the semiconductor film 508. In this case, for example, the field-effect mobility of the transistor can be higher than that of a transistor that uses hydrogenated amorphous silicon for the semiconductor film 508. Alternatively, for example, the driving capability can be higher than that of a transistor that uses hydrogenated amorphous silicon for the semiconductor film 508. Alternatively, for example, the aperture ratio of the pixel can be higher than that in the case of using a transistor that uses hydrogenated amorphous silicon for the semiconductor film 508.

Alternatively, for example, the reliability of the transistor can be higher than that of a transistor that uses hydrogenated amorphous silicon for the semiconductor film 508.

Alternatively, the temperature required for fabrication of the transistor can be lower than that required for a transistor that uses single crystal silicon, for example.

Alternatively, the semiconductor film used for the transistor in the driver circuit can be formed in the same process as the semiconductor film used for the transistor in the pixel circuit. Alternatively, the driver circuit can be formed over the same substrate over which the pixel circuit is formed. Alternatively, the number of components included in an electronic device can be reduced.

[Single Crystal Silicon]

For example, single crystal silicon can be used for the semiconductor film 508. In this case, for example, the resolution can be higher than that of a display panel that uses hydrogenated amorphous silicon for the semiconductor film 508. Alternatively, a display panel having less display unevenness than a display panel that uses polysilicon for the semiconductor film 508 can be provided. Alternatively, for example, smart glasses or a head mounted display can be provided.

<<Structure Example 2 of Semiconductor Film 508>>

For example, a metal oxide can be used for the semiconductor film 508. Thus, a pixel circuit can hold an image signal for a longer time than a pixel circuit utilizing a transistor that uses amorphous silicon for a semiconductor film. Specifically, a selection signal can be supplied at a frequency of lower than 30 Hz, preferably lower than 1 Hz, further preferably less than once per minute with the suppressed occurrence of flickers. Consequently, fatigue accumulation in a user of a data processing device can be reduced. Moreover, power consumption for driving can be reduced.

A transistor using an oxide semiconductor can be used, for example. Specifically, an oxide semiconductor containing indium or an oxide semiconductor containing indium, gallium, and zinc can be used for the semiconductor film.

A transistor having a lower leakage current in an off state than a transistor that uses amorphous silicon for a semiconductor film can be used, for example. Specifically, a transistor that uses an oxide semiconductor for a semiconductor film can be used.

A 25-nm-thick film containing indium, gallium, and zinc can be used as the semiconductor film 508, for example.

A conductive film in which a 10-nm-thick film containing tantalum and nitrogen and a 300-nm-thick film containing copper are stacked can be used as the conductive film 504, for example. Note that the film containing copper includes a region; between the region and the insulating film 506, the film containing tantalum and nitrogen is positioned.

A stacked-layer film in which a 400-nm-thick film containing silicon and nitrogen and a 200-nm-thick film containing silicon, oxygen, and nitrogen are stacked can be used for the insulating film 506, for example. Note that the film containing silicon and nitrogen includes a region; between the region and the semiconductor film 508, the film containing silicon, oxygen, and nitrogen is positioned.

A conductive film in which a 50-nm-thick film containing tungsten, a 400-nm-thick film containing aluminum, and a 100-nm-thick film containing titanium are stacked in this order can be used as the conductive film 512A or the conductive film 512B, for example. Note that the film containing tungsten includes a region in contact with the semiconductor film 508.

A manufacturing line for a bottom-gate transistor that uses amorphous silicon as a semiconductor can be easily remodeled into a manufacturing line for a bottom-gate transistor that uses an oxide semiconductor as a semiconductor, for example. Furthermore, for example, a manufacturing line for a top-gate transistor that uses polysilicon as a semiconductor can be easily remodeled into a manufacturing line for a top-gate transistor that uses an oxide semiconductor as a semiconductor. In either remodeling, an existing manufacturing line can be effectively utilized.

This can suppress flickering. Alternatively, the power consumption can be reduced. Alternatively, a moving image with quick movements can be smoothly displayed. Alternatively, a photograph and the like can be displayed with a wide range of grayscale. As a result, a novel display panel that is highly convenient, useful, or reliable can be provided.

<<Structure Example 3 of Semiconductor Film 508>>

For example, a compound semiconductor can be used as the semiconductor of the transistor. Specifically, a semiconductor containing gallium arsenide can be used.

For example, an organic semiconductor can be used as the semiconductor of the transistor. Specifically, an organic semiconductor containing polyacene or graphene can be used for a semiconductor film.

<<Structure Example 1 of Capacitor>>

The capacitor C21 includes a plurality of conductive films and an insulating film. One conductive film overlaps with the other conductive film, and the insulating film includes a region positioned between the conductive films.

For example, the conductive film 504, the conductive film 512A, and the insulating film 506 can be used for the capacitor.

<<Structure Example 2 of Functional Layer 520>>

The functional layer 520 includes an insulating film 521, an insulating film 518, an insulating film 516, the insulating film 506, an insulating film 501C, and the like (see FIG. 4(B)).

The insulating film 521 includes a region positioned between the pixel circuit 530(i,j) and the display element 550(i,j).

The insulating film 518 includes a region positioned between the insulating film 521 and the insulating film 501C.

The insulating film 516 includes a region positioned between the insulating film 518 and the insulating film 501C.

The insulating film 506 includes a region positioned between the insulating film 516 and the insulating film 501C.

[Insulating Film 521]

An insulating inorganic material, an insulating organic material, or an insulating composite material containing an inorganic material and an organic material, for example, can be used for the insulating film 521.

Specifically, an inorganic oxide film, an inorganic nitride film, an inorganic oxynitride film, or the like, or a layered material in which a plurality of films selected from these films are stacked can be used as the insulating film 521.

For example, a film including a silicon oxide film, a silicon nitride film, a silicon oxynitride film, an aluminum oxide film, or the like, or a film including a layered material in which a plurality of films selected from these films are stacked can be used as the insulating film 521. Note that the silicon nitride film is a dense film and has an excellent function of inhibiting diffusion of impurities.

For example, for the insulating film 521, polyester, polyolefin, polyamide, polyimide, polycarbonate, polysiloxane, an acrylic resin, or the like, or a layered material, a composite material, or the like of a plurality of resins selected from these resins can be used. Alternatively, a photosensitive material may be used. Thus, the insulating film 521 can planarize a level difference due to various components overlapping with the insulating film 521, for example.

Note that polyimide is excellent in thermal stability, insulating property, toughness, low dielectric constant, low coefficient of thermal expansion, chemical resistance, and other properties compared with other organic materials. Accordingly, in particular, polyimide can be suitably used for the insulating film 521 or the like.

For example, a film formed using a photosensitive material can be used as the insulating film 521. Specifically, a film formed using photosensitive polyimide, a photosensitive acrylic resin, or the like can be used as the insulating film 521.

[Insulating Film 518]

The material that can be used for the insulating film 521, for example, can be used for the insulating film 518.

For example, a material that has a function of inhibiting diffusion of oxygen, hydrogen, water, an alkali metal, an alkaline earth metal, and the like can be used for the insulating film 518. Specifically, a nitride insulating film can be used as the insulating film 518. For example, silicon nitride, silicon nitride oxide, aluminum nitride, aluminum nitride oxide, or the like can be used for the insulating film 518. Thus, diffusion of impurities to a semiconductor film of a transistor can be inhibited.

[Insulating Film 516]

The material that can be used for the insulating film 521, for example, can be used for the insulating film 516.

Specifically, a film formed by a fabrication method different from that of the insulating film 518 can be used as the insulating film 516.

[Insulating Film 506]

The material that can be used for the insulating film 521, for example, can be used for the insulating film 506.

Specifically, a film including a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film can be used as the insulating film 506.

[Insulating Film 501D]

The insulating film 501D includes a region positioned between the insulating film 501C and the insulating film 516.

The material that can be used for the insulating film 506, for example, can be used for the insulating film 501D.

[Insulating Film 501C]

The material that can be used for the insulating film 521, for example, can be used for the insulating film 501C. Specifically, a material containing silicon and oxygen can be used for the insulating film 501C. Thus, diffusion of impurities into the pixel circuit, the display element, or the like can be inhibited.

<<Structure Example 3 of Functional Layer 520>>

The functional layer 520 includes a conductive film, a wiring, and a terminal. A material having conductivity can be used for a wiring, an electrode, a terminal, a conductive film, or the like.

For example, an inorganic conductive material, an organic conductive material, a metal, a conductive ceramic, or the like can be used for the wiring or the like.

Specifically, a metal element selected from aluminum, gold, platinum, silver, copper, chromium, tantalum, titanium, molybdenum, tungsten, nickel, iron, cobalt, palladium, and manganese, or the like can be used for the wiring or the like. Alternatively, an alloy containing the above-described metal element, or the like can be used for the wiring or the like. In particular, an alloy of copper and manganese is suitable for microfabrication using a wet etching method.

Specifically, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure of a titanium film, an aluminum film stacked over the titanium film, and a titanium film further formed thereover, or the like can be used for the wiring or the like.

Specifically, a conductive oxide such as indium oxide, indium tin oxide, indium zinc oxide, zinc oxide, or zinc oxide to which gallium is added can be used for the wiring or the like.

Specifically, a film containing graphene or graphite can be used for the wiring or the like.

For example, a film containing graphene oxide is formed and the film containing graphene oxide is reduced, so that a film containing graphene can be formed. As a reducing method, a method with application of heat, a method using a reducing agent, or the like can be given.

For example, a film including a metal nanowire can be used for the wiring or the like.

Specifically, a nanowire containing silver can be used.

Specifically, a conductive polymer can be used for the wiring or the like.

Note that a terminal 519B can be electrically connected to a flexible printed circuit FPC1 using a conductive material, for example (see FIG. 3(A)). Specifically, the terminal 519B can be electrically connected to the flexible printed circuit FPC1 using a conductive material.

<<Structure Example 4 of Functional Layer 520>>

The functional layer 520 includes the pixel circuit 530(i,j) and the insulating film 516. For example, an insulating film having a bottom surface and a top surface that faces the bottom surface can be used as the insulating film 516.

Specifically, an insulating film having a bottom surface that is in contact with the semiconductor film 508 and a top surface that is in contact with a semiconductor film 508(2) can be used as the insulating film 516 (see FIG. 6(B) and FIG. 6(C)).

For example, a stacked-layer film can be used as the insulating film 516. Specifically, part of the insulating film 516 can be formed over the semiconductor film 508, a different part of the insulating film 516 can be formed over the part, and the semiconductor film 508(2) can be formed over the different part.

<<Structure Example 4 of Pixel Circuit 530(i,j)>>

The pixel circuit 530(i,j) includes the switch SW21, the transistor M, and the capacitor C21.

A transistor including a semiconductor film formed in a step different from a step of forming the semiconductor film used in the transistor M can be used as the switch SW21, for example (see FIG. 6(A), FIG. 6(B), and FIG. 6(C)). Alternatively, a transistor including a semiconductor film that has a composition different from the composition of the semiconductor film used in the transistor M can be used as the switch SW21.

Specifically, a transistor including the semiconductor film 508 can be used as the switch SW21, and a transistor including the semiconductor film 508(2) can be used as the transistor M.

Thus, the current drive capability of the transistor M can be higher than that of the transistor used as the switch SW21, for example. Alternatively, a source electrode or a drain electrode of the transistor used as the switch SW21 can be used as a gate electrode of the transistor M. Alternatively, the semiconductor film 508 of the transistor used as the switch SW21 can be closer to the semiconductor film 508(2) of the transistor M. Alternatively, the area occupied by the transistor used as the switch SW21 and the transistor M can be reduced. Alternatively, the aperture ratio of the pixel can be increased. Alternatively, the pixel can be miniaturized. Alternatively, a high-resolution display panel can be provided. Alternatively, the flexibility in the layout of the pixel circuit can be increased. Alternatively, the number of transistors provided in the minute pixel can be increased.

Although not illustrated, another structure may be employed in which the transistor including the semiconductor film 508(2) is used as the switch SW21 and the transistor including the semiconductor film 508 is used as the transistor M, for example.

<Structure Example 3 of Display Panel 700>

The display panel 700 includes a base material 510, a base material 770, and a sealant 705 (see FIG. 4(A)).

<<Base Material 510 and Base Material 770>>

A light-transmitting material can be used for the base material 510 or the base material 770.

For example, a flexible material can be used for the base material 510 or the base material 770. Thus, a flexible display panel can be provided.

For example, a material with a thickness less than or equal to 0.7 mm and greater than or equal to 0.1 mm can be used. Specifically, a material polished to a thickness of approximately 0.1 mm can be used. As a result, the weight can be reduced.

A glass substrate of the 6th generation (1500 mm×1850 mm), the 7th generation (1870 mm×2200 mm), the 8th generation (2200 mm×2400 mm), the 9th generation (2400 mm×2800 mm), the 10th generation (2950 mm×3400 mm), or the like can be used as the base material 510 or the base material 770. Thus, a large-sized display device can be manufactured.

For the base material 510 or the base material 770, an organic material, an inorganic material, a composite material of an organic material and an inorganic material or the like, or the like can be used.

For example, an inorganic material such as glass, ceramic, or a metal can be used. Specifically, non-alkali glass, soda-lime glass, potash glass, crystal glass, aluminosilicate glass, tempered glass, chemically tempered glass, quartz, sapphire, or the like can be used for the base material 510 or the base material 770. Alternatively, aluminosilicate glass, tempered glass, chemically tempered glass, sapphire, or the like can be suitably used for the base material 510 or the base material 770 that is provided on the side close to a user of the display panel. Thus, the display panel can be prevented from being broken or damaged by the use thereof.

Specifically, an inorganic oxide film, an inorganic nitride film, an inorganic oxynitride film, or the like can be used. For example, a silicon oxide film, a silicon nitride film, a silicon oxynitride film, an aluminum oxide film, or the like can be used. Stainless steel, aluminum, or the like can be used for the base material 510 or the base material 770.

For example, a single crystal semiconductor substrate of silicon or silicon carbide, a polycrystalline semiconductor substrate, a compound semiconductor substrate of silicon germanium or the like, an SOI substrate, or the like can be used as the base material 510 or the base material 770. Thus, a semiconductor element can be formed over the base material 510 or the base material 770.

For example, an organic material such as a resin, a resin film, or plastic can be used for the base material 510 or the base material 770. Specifically, a material containing polyester, polyolefin, polyamide (nylon, aramid, or the like), polyimide, polycarbonate, polyurethane, an acrylic resin, an epoxy resin, or a resin having a siloxane bond can be used for the base material 510 or the base material 770. For example, a resin film, a resin plate, a stacked-layer material, or the like containing any of these materials can be used. As a result, the weight can be reduced. Alternatively, for example, the frequency of occurrence of breakage due to dropping or the like can be reduced.

Specifically, polyethylene terephthalate (PET), polyethylene naphthalate (PEN), polyethersulfone (PES), a cycloolefin polymer (COP), a cycloolefin copolymer (COC), or the like can be used for the base material 510 or the base material 770.

For example, a composite material formed by attaching a metal plate, a thin glass plate, or a film of an inorganic material or the like to a resin film or the like can be used for the base material 510 or the base material 770. For example, a composite material formed by dispersing a fibrous or particulate metal, glass, inorganic material, or the like into a resin can be used for the base material 510 or the base material 770. For example, a composite material formed by dispersing a fibrous or particulate resin, an organic material, or the like into an inorganic material can be used for the base material 510 or the base material 770.

Furthermore, a single-layer material or a material in which a plurality of layers are stacked can be used for the base material 510 or the base material 770. For example, a material in which insulating films and the like are stacked can be used. Specifically, a material in which one or a plurality of films selected from a silicon oxide layer, a silicon nitride layer, a silicon oxynitride layer, and the like are stacked can be used. Thus, diffusion of impurities contained in the base material can be prevented, for example. Alternatively, diffusion of impurities contained in glass or a resin can be prevented. Alternatively, diffusion of impurities that pass through a resin can be prevented.

Furthermore, paper, wood, or the like can be used for the base material 510 or the base material 770.

For example, a material having heat resistance high enough to withstand heat treatment in the manufacturing process can be used for the base material 510 or the base material 770. Specifically, a material that is resistant to heat applied in the process of directly forming the transistor, the capacitor, or the like can be used for the base material 510 or the base material 770.

For example, a method in which an insulating film, a transistor, a capacitor, or the like is formed on a substrate which is for use in the process and has heat resistance to heat applied in the manufacturing process, and the formed insulating film, transistor, capacitor, or the like is transferred to the base material 510 or the base material 770 can be used. Accordingly, an insulating film, a transistor, a capacitor, or the like can be formed on a flexible substrate, for example.

<<Sealant 705>>

The sealant 705 includes a region positioned between the functional layer 520 and the base material 770 and has a function of bonding the functional layer 520 and the base material 770 together.

An inorganic material, an organic material, a composite material of an inorganic material and an organic material, or the like can be used for the sealant 705.

For example, an organic material such as a thermally fusible resin or a curable resin can be used for the sealant 705.

For example, an organic material such as a reactive curable adhesive, a photocurable adhesive, a thermosetting adhesive, and/or an anaerobic adhesive can be used for the sealant 705.

Specifically, an adhesive containing an epoxy resin, an acrylic resin, a silicone resin, a phenol resin, a polyimide resin, an imide resin, a PVC (polyvinyl chloride) resin, a PVB (polyvinyl butyral) resin, an EVA (ethylene vinyl acetate) resin, or the like can be used for the sealant 705.

<Structure Example 4 of Display Panel 700>

The display panel 700 includes a functional layer 720 (see FIG. 4(A)). Furthermore, the display panel 700 includes a functional film 770P, a structure body, and the like.

<<Functional Layer 720>>

The functional layer 720 includes the filter MBP and a light-blocking film BM.

<<Light-Blocking Film BM>>

The light-blocking film BM has an opening portion in a region overlapping with the pixel 702(i,j).

<<Structure Body KB1>>

The structure body KB1 includes a region positioned between the functional layer 520 and the base material 770. The structure body KB1 has a function of providing a predetermined space between the functional layer 520 and the base material 770.

<<Functional Film 770P and the Like>>

The functional film 770P includes a region overlapping with the display element 550(0.

An anti-reflection film, a polarizing film, a retardation film, a light diffusion film, a condensing film, or the like can be used as the functional film 770P, for example.

For example, an anti-reflection film with a thickness of 1 µm or less can be used as the functional film 770P. Specifically, a stacked-layer film in which three or more layers, preferably five or more layers, further preferably 15 or more layers of dielectrics are stacked can be used for the functional film 770P. This allows the reflectivity to be as low as 0.5% or less, preferably 0.08% or less.

For example, a circularly polarizing film can be used as the functional film 770P.

Furthermore, an antistatic film suppressing the attachment of a dust, a water repellent film suppressing the attachment of a stain, an antireflective film (anti-reflection film), a non-glare film (anti-glare film), a hard coat film suppressing generation of a scratch in use, or the like can be used as the functional film 770P.

<Structure Example 5 of Display Panel 700>

The display panel 700 also includes an insulating film 528 (see FIG. 4(A)). The display panel 700 also includes an insulating film 573.

<<Insulating Film 528>>

The insulating film 528 includes a region positioned between the insulating film 521 and the base material 770 and has an opening portion in a region overlapping with the display element 550(i,j) (see FIG. 4(A)).

The material that can be used for the insulating film 521, for example, can be used for the insulating film 528. Specifically, a silicon oxide film, a film containing an acrylic resin, a film containing polyimide, or the like can be used as the insulating film 528.

<<Insulating Film 573>>

The insulating film 573 includes a region; between the region and the functional layer 520, the display element 550(i,j) is positioned (see FIG. 4(A)).

For example, a single film or a stacked-layer film in which a plurality of films are stacked can be used as the insulating film 573. Specifically, a stacked-layer film in which an insulating film 573A formed by a method that hardly damages the display element 550(i,j) and a dense insulating film 573B with a few defects are stacked can be used as the insulating film 573. Thus, diffusion of impurities into the display element 550(i,j) can be inhibited.

<<Structure Example of Display Element 550(i,j)>>

A light-emitting element can be used as the display element 550(0. Specifically, an organic electroluminescence element, an inorganic electroluminescence element, a light-emitting diode, a QDLED (Quantum Dot LED), or the like can be used as the display element 550(i,j).

The display element 550(i,j) includes a layer 553(j) containing a light-emitting material (see FIG. 4(A)).

<<Structure Example 1 of Layer 553(j) Containing Light-Emitting Material>>

A layered material stacked to emit white light can be used for the layer 553(j) containing a light-emitting material, for example.

Specifically, materials which emit light with different hues can be used for the layer 553(j) containing a light-emitting material.

For example, a layered material in which a layer containing a light-emitting material including a fluorescent material that emits blue light, and a layer containing materials that are other than a fluorescent material and that emit green light and red light or a layer containing a material that is other than a fluorescent material and that emits yellow light are stacked can be used for the layer 553(j) containing a light-emitting material.

<<Structure Example 2 of Layer 553(j) Containing Light-Emitting Material>>

A light-emitting unit can be used for the layer 553(j) containing a light-emitting material, for example. The light-emitting unit includes one region where electrons injected from one side are recombined with holes injected from the other side. The light-emitting unit contains a light-emitting material, and the light-emitting material releases energy generated by recombination of electrons and holes as light.

A plurality of light-emitting units and an intermediate layer can be used for the layer 553(j) containing a light-emitting material, for example. The intermediate layer includes a region positioned between two light-emitting units. The intermediate layer includes a charge-generation region and has functions of supplying holes to the light-emitting unit provided on the cathode side and supplying electrons to the light-emitting unit provided on the anode side. Furthermore, a structure including a plurality of light-emitting units and an intermediate layer is referred to as a tandem light-emitting element in some cases.

Accordingly, the current efficiency of light emission can be increased. Alternatively, the density of current flowing through the light-emitting element at the same luminance can be reduced. Alternatively, the light-emitting element can have higher reliability.

For example, a stack of a light-emitting unit including a material emitting light with one hue and a light-emitting unit including a material emitting light with a different hue can be used for the layer 553(j) containing a light-emitting material. Alternatively, a stack of a light-emitting unit including a material emitting light with one hue and a light-emitting unit including a material emitting light with the same hue can be used for the layer 553(j) containing a light-emitting material. Specifically, two light-emitting units each containing a material that emits blue light can be stacked and used.

A high molecular compound (e.g., an oligomer, a dendrimer, or a polymer), a middle molecular compound (a compound between a low molecular compound and a high molecular compound with a molecular weight greater than or equal to 400 and less than or equal to 4000), or the like can be used for the layer 553(j) containing a light-emitting material.

<<Electrode 551(i,j) and Electrode 552>>

For example, the material that can be used for the wiring or the like can be used for the electrode 551(i,j) or the electrode 552. Specifically, a material that has a visible-light-transmitting property can be used for the electrode 551(i,j) or the electrode 552.

For example, a conductive oxide, a conductive oxide containing indium, indium oxide, indium tin oxide, indium zinc oxide, zinc oxide, zinc oxide to which gallium is added, or the like can be used. Alternatively, a metal film thin enough to transmit light can be used. Alternatively, a material that has a visible-light-transmitting property can be used.

For example, a metal film that transmits part of light and reflects another part of the light can be used for the electrode 551(i,j) or the electrode 552. The distance between the electrode 551(i,j) and the electrode 552 is adjusted using the layer 553(j) containing a light-emitting material, for example.

Thus, a microcavity structure can be formed in the display element 550(i,j). Alternatively, light of a predetermined wavelength can be extracted more efficiently than other light. Alternatively, light with a narrow half width of a spectrum can be extracted. Alternatively, light of a bright color can be extracted.

For example, a film that reflects light efficiently can be used for the electrode 551(i,j) or the electrode 552. Specifically, a material containing silver, palladium, and the like or a material containing silver, copper, and the like can be used for the electrode 551(i,j) or the electrode 552.

The electrode 551(11) is electrically connected to the pixel circuit 530(i,j) in the opening portion 591A (see FIG. 4(A)). The electrode 551(i,j) overlaps with the opening portion formed in the insulating film 528 and the electrode 551(i,j) is provided with the insulating film 528 in the periphery.

Thus, a short circuit between the electrode 551(i,j) and an electrode 552 can be prevented.

<<Structure Example 2 of Display Region 231>>

The display region 231 includes a plurality of pixels. For example, pixels having a function of displaying colors with different hues can be used for the display region 231.

This enables additive mixture or subtractive mixture of colors displayed by the plurality of pixels. Alternatively, it is possible to display a color of a hue that an individual pixel cannot display.

Note that when a plurality of pixels that display colors with different hues are used for color mixture, each of the pixels can be rephrased as a subpixel. In addition, a set of subpixels can be rephrased as a pixel.

Figure 1C:
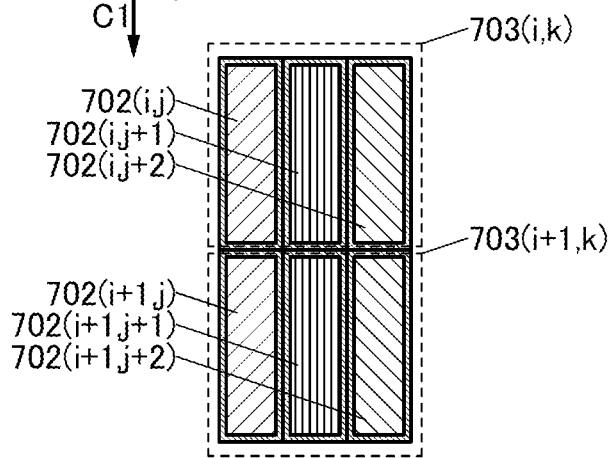
Figure 1D:
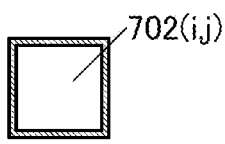

For example, the pixel 702(11) can be rephrased as a subpixel, and a set of the pixel 702(i,j), the pixel 702(i,j+1), and the pixel 702(i,j+2) can be rephrased as a pixel 703(i,k) (see FIG. 1(C)).

Figure 1E:
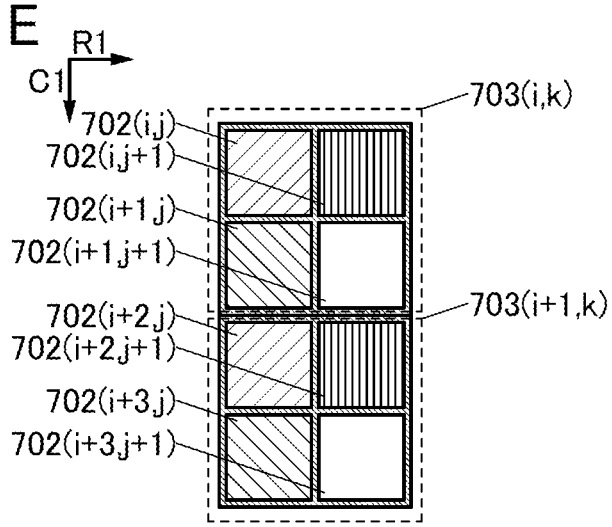

For example, the pixel 702(i,j) can be rephrased as a subpixel, and a set of the pixel 702(i,j), the pixel 702(i,j+1), a pixel 702(i+1,j), and a pixel 702(i+1,j+1) can be rephrased as the pixel 703(i,k) (see FIG. 1(E)).

Specifically, a set of a subpixel that displays blue, a subpixel that displays green, and a subpixel that displays red can be used as the pixel 703(i,k). A set of a subpixel that displays cyan, a subpixel that displays magenta, and a subpixel that displays yellow can be used as the pixel 703(i,k).

Furthermore, the above set to which a subpixel that displays white or the like is added can be used as the pixel, for example.

Note that this embodiment can be combined with other embodiments in this specification as appropriate.

Embodiment 2

In this embodiment, a structure of the display panel of one embodiment of the present invention will be described with reference to FIG. 5 and FIG. 7.

Figure 7:
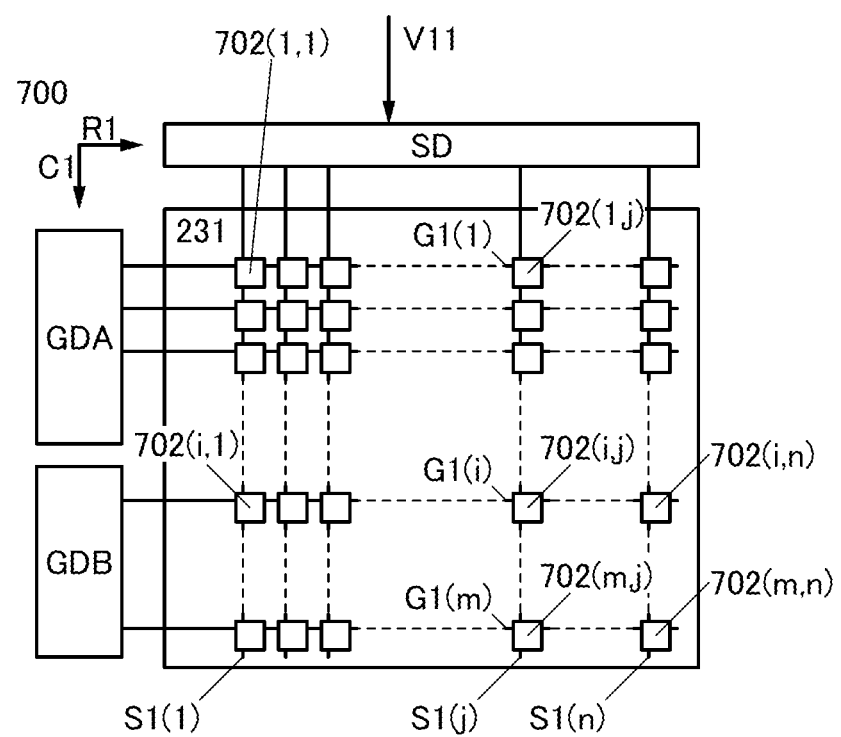
FIG. 7 A block diagram illustrating a structure of a display panel of an embodiment.

FIG. 7 is a diagram illustrating a structure of the display panel of one embodiment of the present invention.

<Structure Example 1 of Display Panel 700>

The display panel 700 described in this embodiment includes a display region 231 (see FIG. 7).

<<Structure Example 1 of Display Region 231>>

The display region 231 includes a group of pixels 702($i$,1) to 702($i$,$n$), a different group of pixels 702(1,$j$) to 702($m$,$j$), a scan line G1($i$), and a signal line S1($j$) (see FIG. 7). Note that i is an integer greater than or equal to 1 and less than or equal to m, j is an integer greater than or equal to 1 and less than or equal to n, and m and n are each an integer greater than or equal to 1.

Although not illustrated, the display region 231 includes a conductive film VCOM2 and a conductive film ANO.

The group of pixels 702($i$,1) to 702($i$,$n$) are arranged in the row direction (the direction indicated by an arrow R1 in the drawing) and include the pixel 702($i$,$j$).

The different group of pixels 702(1,$j$) to 702($m$,$j$) are arranged in the column direction intersecting the row direction (the direction indicated by an arrow C1 in the drawing) and include the pixel 702($i$,$j$).

The scan line G1($i$) is electrically connected to the group of pixels 702($i$,1) to 702($i$,$n$) arranged in the row direction.

The signal line S1($j$) is electrically connected to the different group of pixels 702(1,$j$) to 702($m$, $j$) arranged in the column direction.

Thus, image data can be supplied to a plurality of pixels. As a result, a novel display panel that is highly convenient, useful, or reliable can be provided.

<<Structure Example 2 of Display Region 231>>

The display region 231 includes 2000 or more pixels 703 per inch. Note that the pixel 703 includes a subpixel, and the pixel 702($i$,$j$) can be used as a subpixel, for example. Thus, without changing the structure of the layer 553($j$) containing a light-emitting material for each of the pixels displaying different colors, a high-definition pixel can be formed by a photolithography process. A high-definition image can be displayed. Even when the display region 231 is observed by a magnifier, for example, the pixels can be less likely to be recognized. A virtual reality image can be displayed on a goggle-type head mounted display, for example. A high sense of immersion can be obtained. A wide view can be obtained. As a result, a novel display panel that is highly convenient, useful, or reliable can be provided.

<<Structure Example 3 of Display Region 231>>

The display region 231 includes a plurality of pixels in a matrix. For example, the display region 231 includes 7600 or more pixels in the row direction and 4300 or more pixels in the column direction. Specifically, 7680 pixels are provided in the row direction and 4320 pixels are provided in the column direction.

Thus, a high-definition image can be displayed. As a result, a novel display panel that is highly convenient, useful, or reliable can be provided.

<Structure Example 2 of Display Panel 700>

The display panel 700 described in this embodiment includes one or more driver circuits. For example, a driver circuit GD and a driver circuit SD can be included (see FIG. 7).

<<Driver Circuit GDA and Driver Circuit GDB>>

A driver circuit GDA and a driver circuit GDB can be used as the driver circuit GD. For example, the driver circuit GDA and the driver circuit GDB each have a function of supplying a selection signal on the basis of control data.

Specifically, the driver circuit GDA and the driver circuit GDB have a function of supplying a selection signal to one scan line at a frequency of 30 Hz or higher, preferably 60 Hz or higher, on the basis of the control data. Accordingly, a moving image can be smoothly displayed.

Alternatively, the driver circuit GDA and the driver circuit GDB have a function of supplying a selection signal to one scan line at a frequency lower than 30 Hz, preferably lower than 1 Hz, further preferably less than once a minute, on the basis of the control data. Accordingly, a still image in which flickering is reduced can be displayed.

In the case where a plurality of driver circuits are provided, for example, the frequency at which the driver circuit GDA supplies a selection signal and the frequency at which the driver circuit GDB supplies a selection signal can be made different from each other. Specifically, the selection signal can be supplied at a higher frequency to a region on which a moving image is displayed than to a region on which a still image is displayed. Accordingly, a still image in which flickering is reduced can be displayed on a region, and a moving image can be smoothly displayed on another region.

The frame frequency can be variable. For example, display can be performed at a frame frequency of higher than or equal to 1 Hz and lower than or equal to 120 Hz. Alternatively, display can be performed at a frame frequency of 120 Hz by a progressive method.

A bottom-gate transistor, a top-gate transistor, or the like can be used in the driver circuit GD, for example. Specifically, a transistor MD can be used in the driver circuit GD (see FIG. 5).

Note that, for example, a semiconductor film used in a transistor of the driver circuit GD can be formed in a step of forming a semiconductor film used in a transistor of the pixel circuit 530($i$,$j$).

<<Driver Circuit SD>>

The driver circuit SD has a function of generating an image signal on the basis of data V11 and a function of supplying the image signal to a pixel circuit electrically connected to one display element (see FIG. 7).

A variety of sequential circuits or the like, such as a shift register, can be used as the driver circuit SD, for example.

For example, an integrated circuit formed on a silicon substrate can be used as the driver circuit SD.

An integrated circuit can be connected to a terminal by a COG (Chip on glass) method or a COF (Chip on Film) method, for example. Specifically, an anisotropic conductive film can be used to connect an integrated circuit to a terminal.

Note that this embodiment can be combined with other embodiments in this specification as appropriate.

Embodiment 3

In this embodiment, a structure of a display device of one embodiment of the present invention will be described with reference to FIG. 8.

FIG. 8 is a diagram illustrating the structure of the display device of one embodiment of the present invention. FIG. 8(A) is a block diagram of the display device of one embodiment of the present invention. FIG. 8(B-1) to FIG. 8(B-3) are projection views illustrating the appearance of the display device of one embodiment of the present invention.

<Structure Example of Display Device>

Figure 8A:
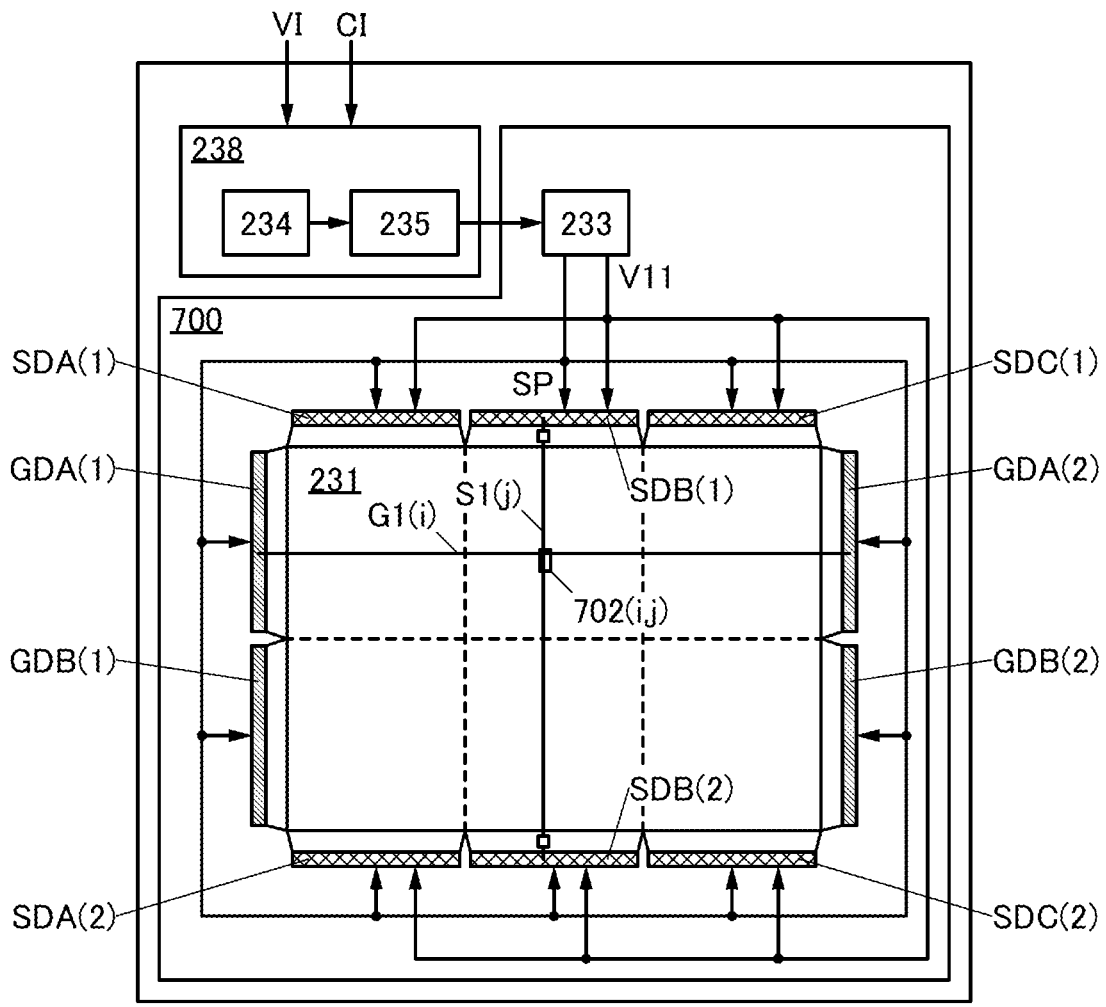
FIGS. 8 (A) and (B-1) to (B-3) Diagrams illustrating structures of a display device of an embodiment.
Figure 8A:
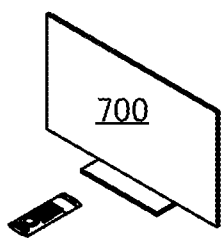
Figure 8A:
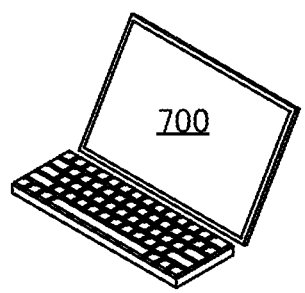
Figure 8A:
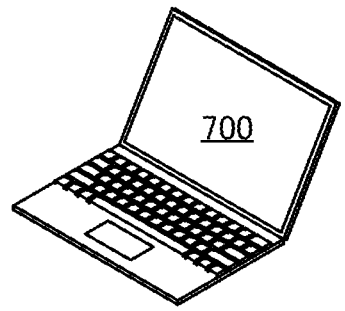

The display device described in this embodiment includes the display panel 700 and a control portion 238 (see FIG. 8(A)).

<<Structure Example 1 of Control Portion 238>>

The control portion 238 is supplied with image data VI and control data CI. For example, a clock signal, a timing signal, or the like can be used as the control data CI.

The control portion 238 generates data V11 on the basis of the image data VI and generates a control signal SP on the basis of the control data CI. Furthermore, the control portion 238 supplies the data V11 and the control signal SP.

The data V11 includes a grayscale of 8 bits or more, preferably 12 bits or more, for example. In addition, a clock signal, a start pulse, or the like of a shift register used for a driver circuit can be used as the control signal SP, for example.

<Structure Example 2 of Control Portion 238>

For example, a decompression circuit 234 and an image processing circuit 235 can be used in the control portion 238.

<<Decompression Circuit 234>>

The decompression circuit 234 has a function of decompressing the image data VI supplied in a compressed state. The decompression circuit 234 includes a memory portion. The memory portion has a function of storing decompressed image data, for example.

<<Image Processing Circuit 235>>

The image processing circuit 235 includes a memory region, for example. The memory region has a function of storing data included in the image data VI, for example.

The image processing circuit 235 has a function of generating the data V11 by correcting the image data VI on the basis of a predetermined characteristic curve and a function of supplying the data V11, for example.

<<Structure Example 1 of Display Panel>>

The display panel 700 is supplied with the data V11 and the control signal SP. For example, a driver circuit can be used in the display panel 700. Specifically, the display panel 700 described in Embodiment 1 or Embodiment 2 can be used.

<<Driver Circuit>>

The driver circuit operates on the basis of the control signal SP. Using the control signal SP enables a synchronized operation of a plurality of driver circuits.

For example, a driver circuit GDA(1), a driver circuit GDA(2), a driver circuit GDB(1) and a driver circuit GDB(2) can be used in the display panel. The driver circuit GDA(1), the driver circuit GDA(2), the driver circuit GDB(1), and the driver circuit GDB(2) are supplied with the control signal SP and have a function of supplying a selection signal.

For example, a driver circuit SDA(1), a driver circuit SDA(2), a driver circuit SDB(1), a driver circuit SDB(2), a driver circuit SDC(1), and a driver circuit SDC(1) can be used in the display panel. The driver circuit SDA(1), the driver circuit SDA(2), the driver circuit SDB(1), the driver circuit SDB(2), the driver circuit SDC(1), and the driver circuit SDC(1) are supplied with the control signal SP and the data V11 and capable of supplying an image signal.

<<Structure Example of Pixel 702(*i,j*)>>

The pixel 702(*i,j*) performs display on the basis of the data V11.

Thus, the image data can be displayed using the display element. As a result, a novel display device that is highly convenient, useful, or reliable can be provided. Alternatively, for example, a television receiver system (see FIG. 8(B-1)), a video monitor (see FIG. 8(B-2)), a laptop computer (see FIG. 8(B-3)), or the like can be provided.

<<Structure Example 2 of Display Panel>>

For example, the control circuit 233 can be used in the display panel 700. Specifically, the control circuit 233 formed over a rigid substrate can be used for the display panel 700. The control circuit 233 formed over the rigid substrate can be electrically connected to the control portion 238 with the use of a flexible printed circuit.

<<Control Circuit 233>>

The control circuit 233 has a function of generating and supplying the control signal SP. For example, a clock signal, a timing signal, or the like can be used as the control signal SP. Specifically, a timing controller can be used as the control circuit 233.

Note that this embodiment can be combined with other embodiments in this specification as appropriate.

Embodiment 4

In this embodiment, a structure of an input/output device of one embodiment of the present invention will be described with reference to FIG. 9, FIG. 10, and FIG. 11.

Figure 9:
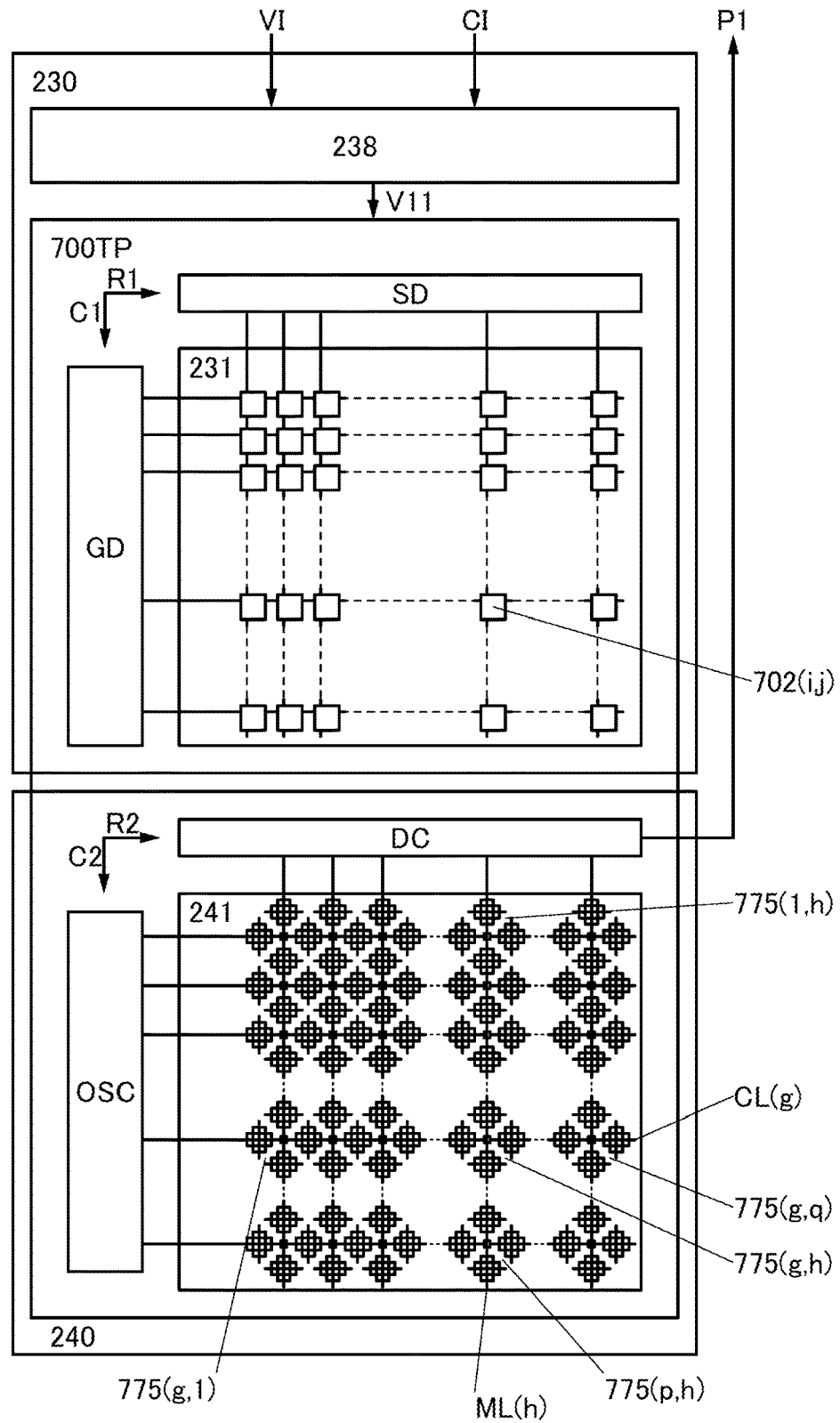
FIG. 9 A block diagram illustrating a structure of an input/output device of an embodiment.

FIG. 9 is a block diagram illustrating the structure of the input/output device of one embodiment of the present invention.

FIG. 10 is a diagram illustrating the structure of the input/output device of one embodiment of the present invention. FIG. 10(A) is a perspective view of the input/output device of one embodiment of the present invention, FIGS. 10(B) and 10(C) are cross-sectional views illustrating part of FIG. 10(A), and FIG. 10(D) shows an electric resistance-stress curve which schematically illustrates characteristics of a sensing element.

Figure 10A:
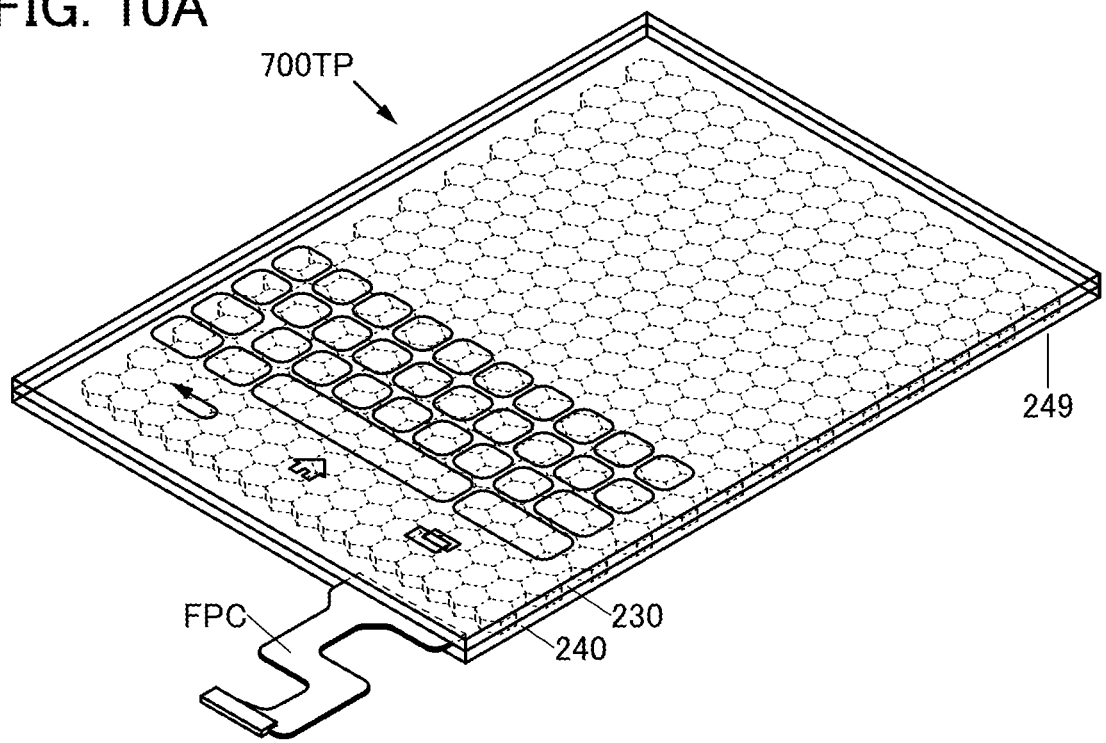
FIG. 10 (A) to (D) Diagrams illustrating a structure of an input/output device of an embodiment.

FIG. 11 is a diagram illustrating the structure of the input/output device of one embodiment of the present invention. FIG. 11(A) is a perspective view of a component used for the input/output device of one embodiment of the present invention, FIGS. 11(B) and 11(C) are cross-sectional views illustrating part of FIG. 10(A), and FIG. 11(D) shows stress-distortion curve which schematically illustrates characteristics of a component in which snap-through buckling occurs.

<Structure Example 1 of Input/Output Device>

The input/output device described in this embodiment includes an input portion 240 and a display portion 230 (see FIG. 9).

<<Display Portion 230>>

The display portion 230 includes a display panel. For example, the display panel 700 described in Embodiment 1 or Embodiment 2 can be used for the display portion 230. Note that a structure including the input portion 240 and the display portion 230 can be referred to as an input/output panel 700TP.

<<Structure Example 1 of Input Portion 240>>

The input portion 240 includes a sensing region 241. The input portion 240 has a function of sensing an object approaching the sensing region 241.

The sensing region 241 includes a region overlapping with the pixel 702(*i,j*).

Thus, the object approaching the region overlapping with the display portion can be sensed while image data is displayed by the display portion. Alternatively, a finger or the like that approaches the display portion can be used as a pointer to input positional data. Alternatively, positional data can be associated with image data displayed on the display portion. As a result, a novel input/output device that is highly convenient, useful, or reliable can be provided.

<<Structure Example 1 of Sensing Region 241>>

The sensing region 241 includes one or more sensing elements, for example.

The sensing region 241 includes a group of sensing elements 775(g,1) to 775(g,q) and a different group of sensing elements 775(1,h) to 775(p,h). Note that g is an integer greater than or equal to 1 and less than or equal to p, h is an integer greater than or equal to 1 and less than or equal to q, and p and q are each an integer greater than or equal to 1.

The group of sensing elements 775(g,1) to 775(g,q) includes a sensing element 775(g,h) and is provided in the row direction (the direction indicated by an arrow R2 in the drawing). Note that the direction indicated by the arrow R2 may be the same as or different from the direction indicated by the arrow R1.

The different group of sensing elements 775(1,h) to 775(p,h) includes the sensing element 775(g,h) and is provided in the column direction (the direction indicated by an arrow C2 in the drawing) that intersects the row direction.

<<Sensing Element>>

The sensing element has a function of sensing an approaching pointer. For example, a finger, a stylus pen, or the like can be used as the pointer. For example, a piece of metal, a coil, or the like can be used for the stylus pen.

Specifically, a capacitive proximity sensor, an electromagnetic inductive proximity sensor, an optical proximity sensor, a resistive proximity sensor, or the like can be used as the sensing element.

A plurality of types of sensing elements can be used in combination. For example, a sensing element that senses a finger and a sensing element that senses a stylus pen can be used in combination.

This allows determination of the kind of a pointer. Alternatively, different instructions can be associated with pieces of sensing data depending on the kind of a pointer that has been determined. Specifically, in the case where it is determined that a finger is used as a pointer, sensing data can be associated with a gesture. Alternatively, in the case where it is determined that a stylus pen is used as a pointer, sensing data can be associated with drawing processing.

Specifically, a finger can be sensed using a capacitive, pressure-sensitive, or optical proximity sensor. Alternatively, a stylus pen can be sensed using an electromagnetic inductive or optical proximity sensor.

<<Structure Example 2 of Input Portion 240>>

The input portion 240 includes an oscillation circuit OSC and a sensing circuit DC (see FIG. 9).

The oscillator circuit OSC supplies a search signal to the sensing element 775(g,h). For example, a rectangular wave, a sawtooth wave, a triangular wave, or a sine wave can be used as the search signal.

The sensing element 775(g,h) generates and supplies a sensing signal that changes in accordance with the search signal and the distance to a pointer approaching the sensing element 775(g,h).

The sensing circuit DC supplies input data in accordance with the sensing signal.

Accordingly, the distance from an approaching pointer to the sensing region 241 can be sensed. Alternatively, the position in the sensing region 241 where the pointer comes the closest can be sensed.

<<Structure Example 1 of Display Region 231>>

Figure 10B:
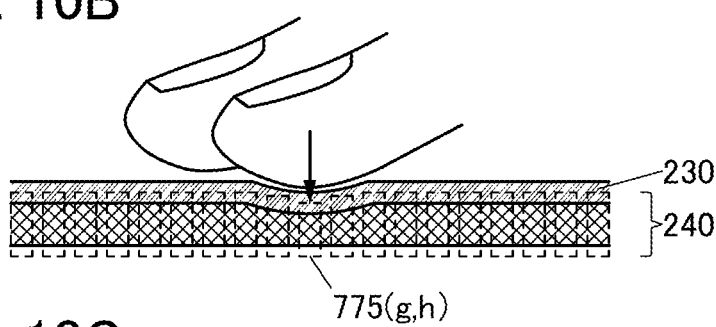
Figure 10C:
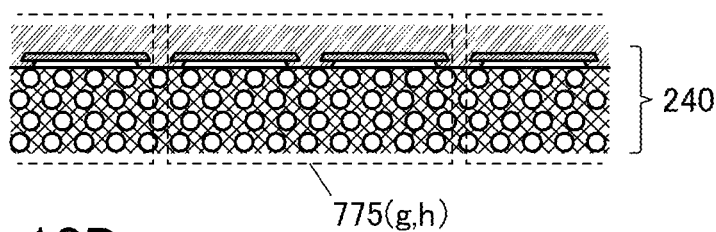
Figure 10D:
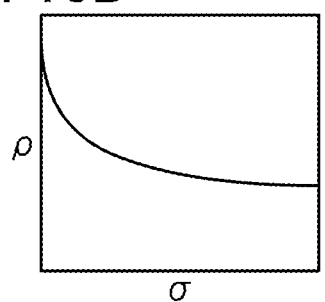

The display region 231 is provided closer to the side where the pointer approaches than the sensing region 241 is, and has flexibility (see FIGS. 10(A) and 10(B)). For example, an image indicating a keyboard can be displayed on the display region 231 (see FIG. 10(A)).

<<Structure Example 2 of Sensing Element>>

The sensing element 775(g,h) has a function of sensing the pushing depth and senses a pointer through the display region 231 (see FIG. 10(B)).

For example, the sensing element 775(g,h) senses the pushing depth toward the sensing element 775(g,h) with the pointer. Specifically, the sensing element 775(g,h) senses the pushing depth from a plane including the display region 231 to a plane including the sensing region 241 with a finger or a stylus pen (see FIG. 10(C)).

For example, a pressure sensor can be used as the sensing element 775(g,h). Specifically, an element whose electric resistance changes in accordance with a pressure can be used for the sensing element 775(g,h) (see FIG. 10(D)). Thus, the sensing element 775(g,h) can sense the pushing depth.

<Structure Example 2 of Input/Output Device>

Figure 11A:
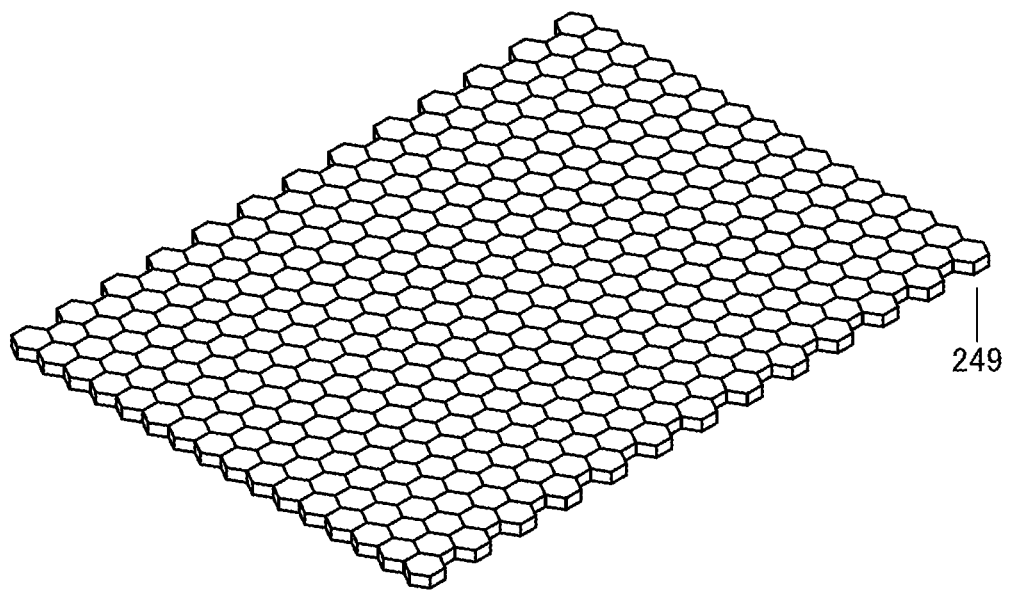
FIG. 11 (A) to (D) Diagrams illustrating a structure of an input/output device of an embodiment.
Figure 11B:
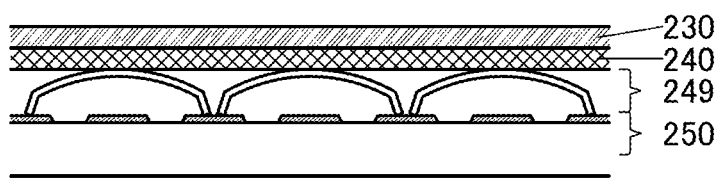

The input/output device described in this embodiment includes a component 249 (see FIGS. 10(A) and 11(A)).

<<Structure Example of Component 249>>

The component 249 overlaps with the sensing region 241 and has elasticity.

For example, an elastic body can be used for the component 249. Specifically, a spring, a plate spring, a rubber, a sponge, or the like can be used.

Thus, the sensing element 775(g,h) can sense the pushing depth. A user can feel the force corresponding to the pushing depth with the pointer.

For example, the component in which snap-through buckling occurs can be used for the component 249. Specifically, as the component 249, a dome-shaped component can be used, for example (see FIG. 11(B)).

Figure 11C:
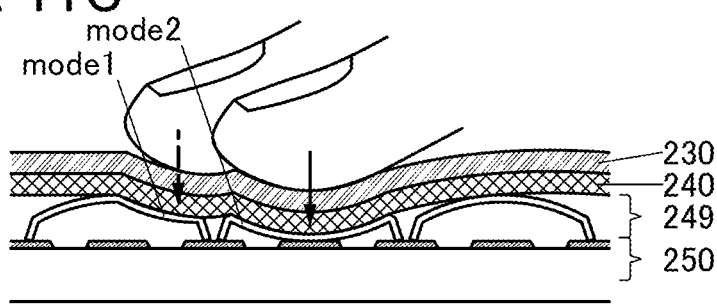
Figure 11D:
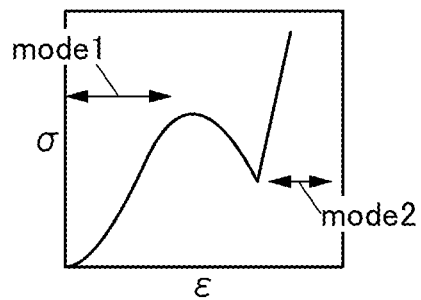

The component 249 has a mode 1 in which the component 249 is stable in a region with small distortion and a mode 2 in which the component 249 is stable in a region with large distortion ε (see FIGS. 11(C) and 11(D)). The component 249 changes from the mode 1 to the mode 2 at the buckling point (see FIG. 11(D)). Furthermore, the component 249 reversibly changes from the mode 2 to the mode 1 when the distortion is eliminated.

Thus, the sensing element 775(g,h) can sense the force σ corresponding to the pushing depth up to the buckling point. A user can obtain a sense of the force. When the force exceeds the buckling point, the user can have a click feeling. What is called a tactile switch can be provided. When the user releases the pushed pointer, the component in which snap-through buckling occurs can return to the original mode.

Note that the sensing region 241 can be provided to overlap with the component in which snap-through buckling occurs, the display region 231 can be provided to overlap with the sensing region 241, and an image used for operation can be displayed at a position overlapping with the component in which snap-through buckling occurs. For example, a layout that is suitably used for a keyboard can be employed for the layout of the components in which snap-through buckling occurs. Alternatively, a layout that is suitably used for a home button can be employed for the layout of the components in which snap-through buckling occurs.

Thus, the displayed images used for operation can be pressed. The user can have a click feeling when pressing the images.

Furthermore, it is possible to use the component 249 including a region where a plurality of components in which snap-through buckling occurs are provided on the whole area. The sensing region 241 can be provided to overlap with the region, the display region 231 can be provided to overlap with the sensing region 241, and the image used for operation can be displayed at a position that overlaps with the region, the whole area of which is provided with the components.

Thus, images which are used for operation and can provide a click feeling by being pressed can be freely laid out.

Note that a sensing portion 250 may be provided to overlap with the input/output device described in this embodiment. For example, a pressure-sensitive switch can be used for the sensing portion 250. Specifically, a conductive material is used for a dome-shaped component in which snap-through buckling occurs, and the dome-shaped component can be used at a contact point with the pressure-sensitive switch. Thus, what is called a membrane switch can be provided. Alternatively, a switch that provides a click feeling can be provided. Alternatively, what is called a tactile switch can be provided.

Note that this embodiment can be combined with other embodiments in this specification as appropriate.

Embodiment 5

In this embodiment, structures of a data processing device of one embodiment of the present invention will be described with reference to FIG. 12 to FIG. 14.

Figure 12A:
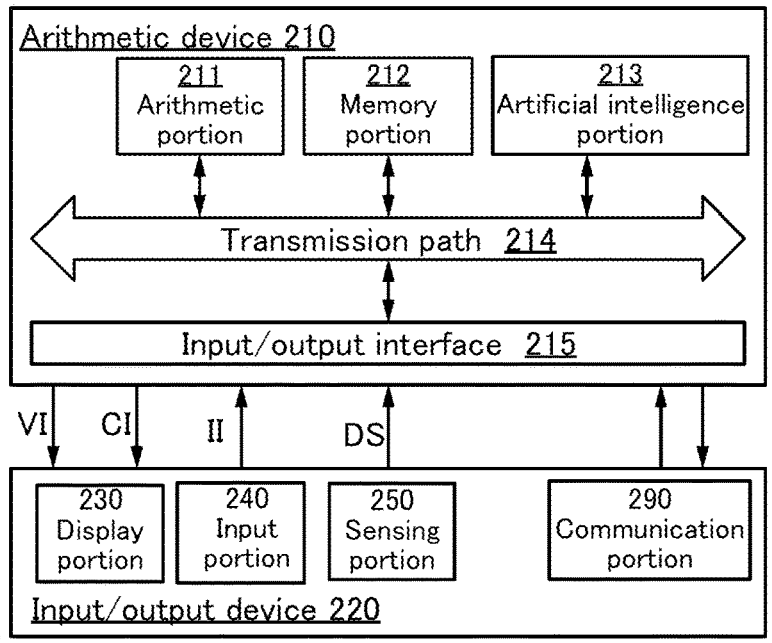
FIG. 12 (A) to (C) A block diagram and projection views illustrating a structure of a data processing device of an embodiment.
Figure 12B:
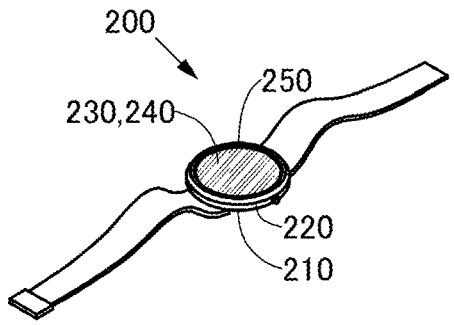
Figure 12C:
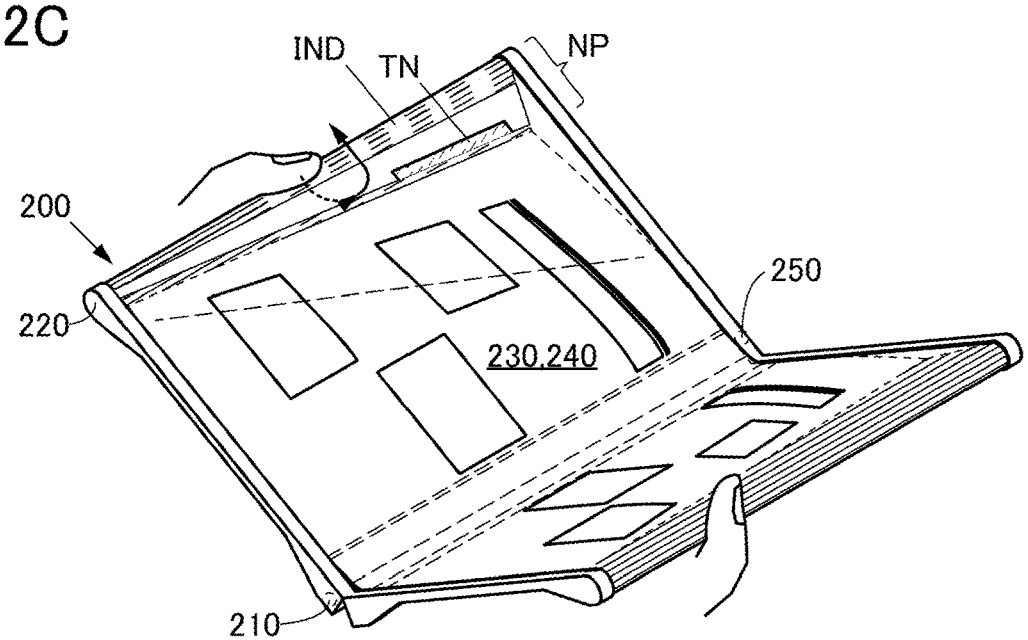

FIG. 12(A) is a block diagram illustrating the structure of the data processing device of one embodiment of the present invention. FIG. 12(B) and FIG. 12(C) are projection views illustrating examples of the appearance of the data processing device.

Figure 13A:
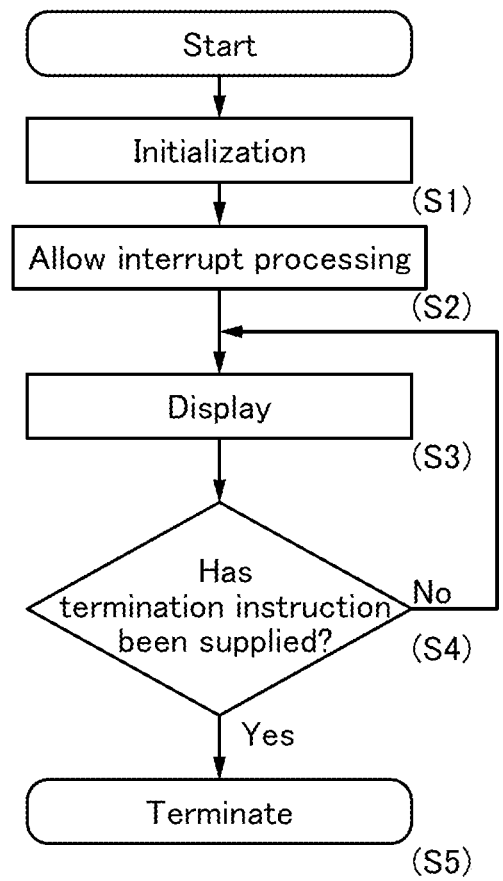
FIGS. 13 (A) and (B) Flow charts showing a method for driving a data processing device of an embodiment.
Figure 13B:
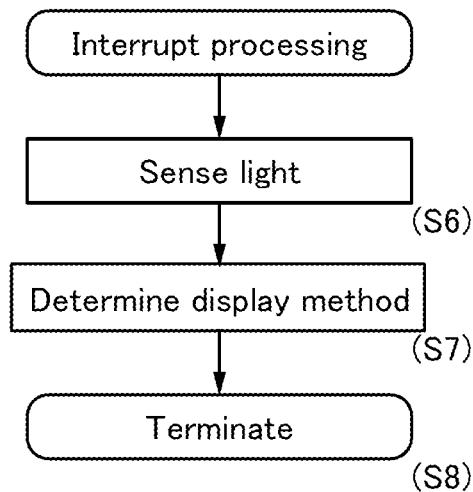

FIG. 13 is a flow chart illustrating a program of one embodiment of the present invention. FIG. 13(A) is a flow chart illustrating main processing of the program of one embodiment of the present invention, and FIG. 13(B) is a flow chart illustrating interrupt processing.

Figure 14A:
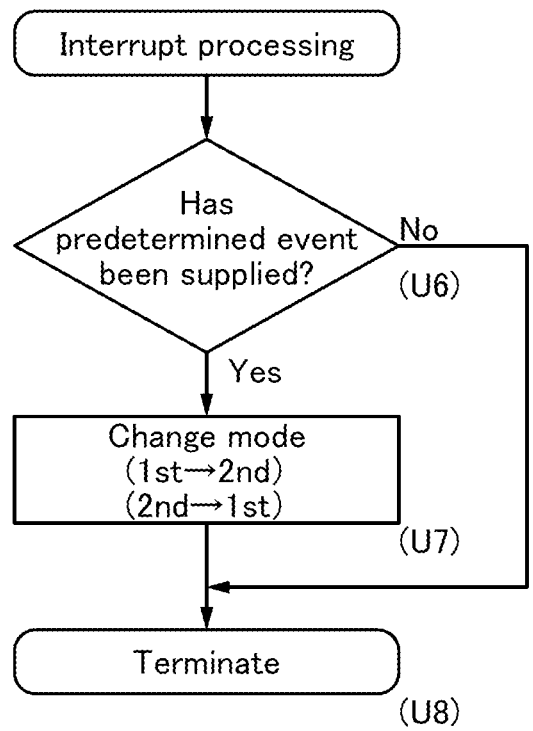
FIG. 14 (A) to (C) Diagrams showing a method for driving a data processing device of an embodiment.
Figure 14B:
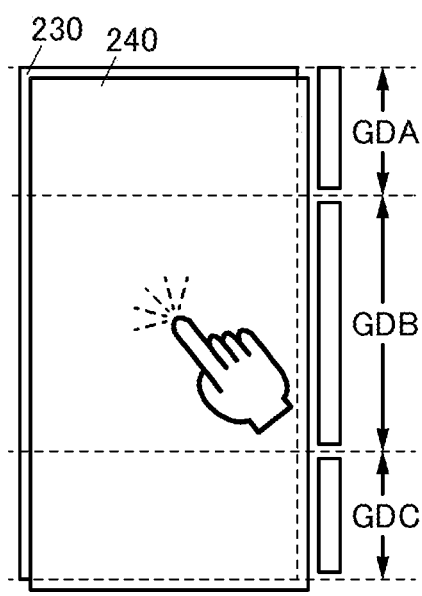
Figure 14C:
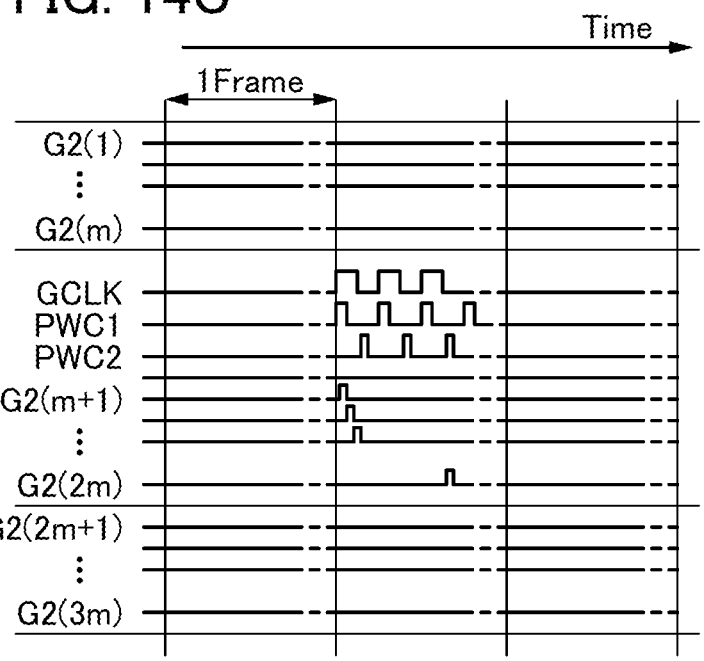

FIG. 14 shows a program of one embodiment of the present invention. FIG. 14(A) is a flow chart illustrating interrupt processing of the program of one embodiment of the present invention. FIG. 14(B) is a schematic view illustrating operation of the data processing device, and FIG. 14(C) is a timing chart illustrating operation of the data processing device of one embodiment of the present invention.

<Structure Example 1 of Data Processing Device>

A data processing device described in this embodiment includes an arithmetic device 210 and an input/output device 220 (see FIG. 12(A)). Note that the input/output device 220 is electrically connected to the arithmetic device 210. A data processing device 200 can also include a housing (see FIG. 12(B) or FIG. 12(C)).

<<Structure Example 1 of Arithmetic Device 210>>

The arithmetic device 210 is supplied with input data II or sensing data DS. The arithmetic device 210 generates the control data CI and the image data VI on the basis of the input data II or the sensing data DS and supplies the control data CI and the image data VI.

The arithmetic device 210 includes an arithmetic portion 211 and a memory portion 212. The arithmetic device 210 includes a transmission path 214 and an input/output interface 215.

The transmission path 214 is electrically connected to the arithmetic portion 211, the memory portion 212, the artificial intelligence portion 213, and the input/output interface 215.

<<Arithmetic Portion 211>>

The arithmetic portion 211 has a function of executing a program, for example.

<<Memory Portion 212>>

The memory portion 212 has a function of storing, for example, the program executed by the arithmetic portion 211, initial data, setting data, an image, or the like.

Specifically, a hard disk, a flash memory, a memory using a transistor including an oxide semiconductor, or the like can be used.

<<Input/Output Interface 215 and Transmission Path 214>>

The input/output interface 215 includes a terminal or a wiring and has a function of supplying data and being supplied with data. The input/output interface 215 can be electrically connected to the transmission path 214, for example. The input/output interface 215 can also be electrically connected to the input/output device 220.

The transmission path 214 includes a wiring and has a function of supplying data and being supplied with data. The transmission path 214 can be electrically connected to the input/output interface 215, for example. The transmission path 214 can also be electrically connected to the arithmetic portion 211, the memory portion 212, the artificial intelligence portion 213, and the input/output interface 215.

<<Structure Example of Input/Output Device 220>>

The input/output device 220 supplies the input data II and the sensing data DS. The input/output device 220 is supplied with the control data CI and the image data VI (see FIG. 12(A)).

As the input data II, for example, a scan code of a keyboard, positional data, operation data of buttons, sound data, image data, or the like can be used. Alternatively, for example, illuminance data, attitude data, acceleration data, bearing data, pressure data, temperature data, humidity data, or the like of an environment where the data processing device 200 is used, or the like can be used as the sensing data DS.

As the control data CI, for example, a signal controlling the luminance of display of the image data VI, a signal controlling the color saturation, or a signal controlling the hue can be used. Alternatively, a signal that changes display of part of the image data VI can be used as the control data CI.

The input/output device 220 includes the display portion 230, the input portion 240, and a sensing portion 250. For example, the input/output device described in Embodiment 4 can be used.

<<Structure Example of Display Portion 230>>

The display portion 230 displays the image data VI on the basis of the control data CI.

The display portion 230 includes the control portion 238, the driver circuit GD, the driver circuit SD, and the display panel 700 (see FIG. 8). For example, the display device described in Embodiment 3 can be used for the display portion 230.

<<Structure Example of Input Portion 240>>

The input portion 240 generates the input data II. For example, the input portion 240 has a function of supplying positional data P1.

For example, a human interface or the like can be used for the input portion 240 (see FIG. 12(A)). Specifically, a keyboard, a mouse, a touch sensor, a microphone, a camera, or the like can be used as the input portion 240.

Moreover, a touch sensor including a region overlapping with the display portion 230 can be used. Note that an input/output device including the display portion 230 and a touch sensor including a region overlapping with the display portion 230 can be referred to as a touch panel or a touch screen.

A user can make various gestures (tap, drag, swipe, pinch in, and the like) using his/her finger touching the touch panel as a pointer, for example.

The arithmetic device 210, for example, analyzes data on the position, path, or the like of the finger in contact with the touch panel and can determine that a predetermined gesture is supplied when the analysis results meet predetermined conditions. Thus, the user can supply a predetermined operation instruction associated with the predetermined gesture in advance by using the gesture.

For instance, the user can supply a "scroll instruction" for changing the display position of image data by using a gesture of moving the finger in contact with the touch panel along the touch panel.

The user can supply a dragging instruction for pulling out and displaying a navigation panel NP at an edge portion of the display region 231, by using a gesture of moving a finger touching the edge portion of the display region 231 (see FIG. 12(C)). Moreover, the user can supply a leafing through instruction for displaying index images IND, some parts of other pages, or thumbnail images TN of other pages in an predetermined order on the navigation panel NP so that the user can flip through these images, by using a gesture of moving the position where a finger presses hard or by using the pressure of pressing the finger. Consequently, the user can turn the pages of an e-book like flipping through the pages of a paper book. Moreover, the user can search a given page with the aid of the thumbnail images TN or the index images IND.

<<Structure Example of Sensing Portion 250>>

The sensing portion 250 generates the sensing data DS. The sensing portion 250 has a function of sensing the illuminance of the environment where the data processing device 200 is used and a function of supplying illuminance data, for example.

The sensing portion 250 has a function of sensing the ambient conditions and supplying the sensing data. Specifically, the sensing portion 250 can supply illuminance data, attitude data, acceleration data, bearing data, pressure data, temperature data, humidity data, or the like.

For example, a photosensor, an attitude sensor, an acceleration sensor, a direction sensor, a GPS (Global positioning System) signal receiving circuit, a pressure-sensitive switch, a pressure sensor, a temperature sensor, a humidity sensor, a camera, or the like can be used as the sensing portion 250.

<<Communication Portion 290>>

A communication portion 290 has a function of supplying data to a network and obtaining data from the network.

<<Housing>>

Note that the housing has a function of storing the input/output device 220 or the arithmetic device 210. Alternatively, the housing has a function of supporting the display portion 230 or the arithmetic device 210.

Thus, the control data can be generated on the basis of the input data or the sensing data. Alternatively, the image data can be displayed on the basis of the input data or the sensing data. Alternatively, the data processing device can determine the intensity of light received by the housing of the data processing device and operate under the environment where the data processing device is used. Alternatively, a user of the data processing device can select a display method. As a result, a novel data processing device that is highly convenient, useful, or reliable can be provided.

Note that in some cases, these components cannot be clearly distinguished from each other and one component may also serve as another component or include part of another component. For example, a touch panel in which a touch sensor overlaps with a display panel is an input portion as well as a display portion.

<<Structure Example 2 of Arithmetic Device 210>>

The arithmetic device 210 includes an artificial intelligence portion 213 (see FIG. 12(A)).

The artificial intelligence portion 213 is supplied with the input data II or the sensing data DS, and the artificial intelligence portion 213 infers the control data CI on the basis of the input data II or the sensing data DS. Moreover, the artificial intelligence portion 213 supplies the control data CI.

In this manner, the control data CI for display that can be felt suitable can be generated. Alternatively, display that can be felt suitable is possible. Alternatively, the control data CI for display that can be felt comfortable can be generated. Alternatively, display that can be felt comfortable is possible. As a result, a novel data processing device that is highly convenient, useful, or reliable can be provided.

[Natural Language Processing on Input Data II]

Specifically, the artificial intelligence portion 213 can perform natural language processing on the input data II to extract one feature from the whole input data II. For example, the artificial intelligence portion 213 can infer emotion or the like put in the input data II, which can be a feature. The artificial intelligence portion 213 can infer the color, design, font, or the like empirically felt suitable for the feature. The artificial intelligence portion 213 can generate data specifying the color, design, or font of a letter or data specifying the color or design of the background, and the data can be used as the control data CI.

Specifically, the artificial intelligence portion 213 can perform natural language processing on the input data II to extract some words included in the input data II. For example, the artificial intelligence portion 213 can extract expressions including a grammatical error, a factual error, emotion, and the like. The artificial intelligence portion 213 can generate data for display of extracted part in the color, design, font, or the like different from those of another part, and the data can be used as the control data CI.

[Image Processing on Input Data II]

Specifically, the artificial intelligence portion 213 can perform image processing on the input data II to extract one feature from the input data II. For example, the artificial intelligence portion 213 can infer the age where an image of the input data II is taken, whether the image is taken indoors or outdoors, whether the image is taken in the daytime or at night, or the like, which can be a feature. The artificial intelligence portion 213 can infer the color tone empirically felt suitable for the feature and generate the control data CI for use of the color tone for display. Specifically, data specifying color (e.g., full color, monochrome, or sepia) used for expression of a gradation can be used as the control data CI.

Specifically, the artificial intelligence portion 213 can perform image processing on the input data II to extract some images included in the input data II. For example, the artificial intelligence portion 213 can generate the control data CI for display of a boundary between extracted part of the image and another part. Specifically, the artificial intelligence portion 213 can generate the control data CI for display of a rectangle surrounding the extracted part of the image.

[Inference Using Sensing Data DS]

Specifically, the artificial intelligence portion 213 can generate an inference using the sensing data DS. Alternatively, the artificial intelligence portion 213 can generate the control data CI on the basis of inference so that the user of the data processing device 200 can feel comfortable.

Specifically, the artificial intelligence portion 213 can generate the control data CI for adjustment of display brightness on the basis of the ambient illuminance or the like so that the display brightness can be felt comfortable. Alternatively, the artificial intelligence portion 213 can generate the control data CI for adjustment of volume on the basis of the ambient noise or the like so that the volume can be felt comfortable.

As the control data CI, a clock signal, a timing signal, or the like that is supplied to the control portion 238 included in the display portion 230 can be used. Alternatively, a clock signal, a timing signal, or the like that is supplied to a control portion 248 included in the input portion 240 can be used as the control data CI.

<Structure Example 2 of Data Processing Device>

Another structure of the data processing device of one embodiment of the present invention is described with reference to FIG. 13(A) and FIG. 13(B).

<<Program>>

A program of one embodiment of the present invention has the following steps (see FIG. 13(A)).

[First Step]

In a first step, setting is initialized (see FIG. 13(A)(S1)).

For example, predetermined image data which is to be displayed on start-up and data for determining a predetermined mode of displaying the image data and a predetermined display method for displaying the image data are acquired from the memory portion 212. Specifically, one still image data or another moving image data can be used as the predetermined image data. Furthermore, a first mode or a second mode can be used as the predetermined mode.

[Second Step]

In a second step, interrupt processing is allowed (see FIG. 13(A)(S2)). Note that an arithmetic device allowed to execute the interrupt processing can perform the interrupt processing in parallel with the main processing. The arithmetic device that has returned from the interrupt processing to the main processing can reflect the results obtained through the interrupt processing in the main processing.

The arithmetic device may execute the interrupt processing when a counter has an initial value, and the counter may be set at a value other than the initial value when the arithmetic device returns from the interrupt processing. Thus, the interrupt processing can always follow the start-up of the program.

[Third Step]

In a third step, image data is displayed by a predetermined mode or a predetermined display method selected in the first step or the interrupt processing (see FIG. 13(A)(S3)). Note that the predetermined mode determines a mode of displaying the data, and the predetermined display method determines a method for displaying the image data. For example, the image data VI can be used as data to be displayed.

One method for displaying the image data VI can be associated with the first mode, for example. Alternatively, another method for displaying the image data VI can be associated with the second mode. Thus, a display method can be selected on the basis of the selected mode.

<<First Mode>>

Specifically, a method for supplying selection signals to a scan line at a frequency of 30 Hz or higher, preferably 60 Hz or higher, and performing display on the basis of the selection signals can be associated with the first mode.

For example, when selection signals are supplied at a frequency of 30 Hz or higher, preferably 60 Hz or higher, the movement of a moving image can be smoothly displayed.

For example, when an image is refreshed at a frequency of 30 Hz or higher, preferably 60 Hz or higher, an image that changes so as to smoothly follow the user's operation can be displayed on the data processing device 200 which is being operated by the user.

<<Second Mode>>

Specifically, a method for supplying selection signals to a scan line at a frequency lower than 30 Hz, preferably lower than 1 Hz, further preferably less than once a minute, and performing display on the basis of the selection signals can be associated with the second mode.

The supply of selection signals at a frequency lower than 30 Hz, preferably lower than 1 Hz, further preferably less than once a minute enables display with a flicker or flickering suppressed. Furthermore, the power consumption can be reduced.

For example, when the data processing device 200 is used for a clock, the display can be refreshed at a frequency of once a second, once a minute, or the like.

Note that when a light-emitting element is used as the display element, for example, the light-emitting element can be made to emit light in a pulsed manner so that image data is displayed. Specifically, an organic EL element can be made to emit light in a pulsed manner, and its afterglow can be used for display. The organic EL element has excellent frequency characteristics; thus, time for driving the light-emitting element can be shortened, and thus the power consumption can be reduced in some cases. Alternatively, heat generation is inhibited; thus, the deterioration of the light-emitting element can be suppressed in some cases.

[Fourth Step]

In a fourth step, selection is performed such that the program proceeds to a fifth step when a termination instruction has been supplied, whereas the program proceeds to the third step when the termination instruction has not been supplied (see FIG. 13(A)(S4)).

For example, the termination instruction supplied in the interrupt processing may be used for the determination.

[Fifth Step]

In the fifth step, the program terminates (see FIG. 13(A)(S5)).

<<Interrupt Processing>>

The interrupt processing includes a sixth step to an eighth step described below (see FIG. 13(B)).

[Sixth Step]

In the sixth step, the illuminance of the environment where the data processing device 200 is used is sensed using the sensing portion 250, for example (see FIG. 13(B)(S6)). Note that color temperature or chromaticity of ambient light may be sensed instead of the illuminance of the environment.

[Seventh Step]

In the seventh step, a display method is determined on the basis of the sensed illuminance data (see FIG. 13(B)(S7)). For example, a display method is determined such that the brightness of display is not too dark or too bright.

Note that in the case where the color temperature of the ambient light or the chromaticity of the ambient light is sensed in the sixth step, the color of display may be adjusted.

[Eighth Step]

In the eighth step, the interrupt processing terminates (see FIG. 13(B)(58)).

<Structure Example 3 of Data Processing Device>

Another structure of the data processing device of one embodiment of the present invention is described with reference to FIG. 14.

FIG. 14(A) is a flow chart illustrating a program of one embodiment of the present invention. FIG. 14(A) is a flow chart illustrating interrupt processing different from the interrupt processing shown in FIG. 13(B).

Note that the structure example 3 of the data processing device is different from the interrupt processing described with reference to FIG. 13(B) in that the interrupt processing includes a step of changing a mode on the basis of a supplied predetermined event. Different portions will be described in detail here, and refer to the above description for portions that can use similar structures.

<<Interrupt Processing>>

The interrupt processing includes a sixth step to an eighth step described below (see FIG. 14(A)).

[Sixth Step]

In the sixth step, the program proceeds to the seventh step when a predetermined event has been supplied, whereas the program proceeds to the eighth step when the predetermined event has not been supplied (see FIG. 14(A)(U6)). For example, whether the predetermined event is supplied in a predetermined period or not can be used as a condition. Specifically, the predetermined period can be longer than 0 seconds, and shorter than or equal to 5 seconds, shorter than or equal to 1 second, or shorter than or equal to 0.5 seconds, preferably shorter than or equal to 0.1 seconds.

[Seventh Step]

In the seventh step, the mode is changed (see FIG. 14(A)(U7)). Specifically, the second mode is selected in the case where the first mode has been selected, and the first mode is selected in the case where the second mode has been selected.

For example, it is possible to change the display mode of a region that is part of the display portion 230. Specifically, the display mode of a region where one driver circuit in the display portion 230 including the driver circuit GDA, the driver circuit GDB, and a driver circuit GDC supplies a selection signal can be changed (see FIG. 14(B)).

For example, the display mode of the region where a selection signal is supplied from the driver circuit GDB can be changed when a predetermined event is supplied to the input portion 240 in a region overlapping with the region where a selection signal is supplied from the driver circuit GDB (see FIG. 14(B) and FIG. 14(C)). Specifically, the frequency of supply of the selection signal from the driver circuit GDB can be changed in accordance with a "tap" event supplied to a touch panel with a finger or the like.

A signal GCLK is a clock signal controlling the operation of the driver circuit GDB, and a signal PWC1 and a signal PWC2 are pulse width control signals controlling the operation of the driver circuit GDB. The driver circuit GDB supplies selection signals to a scan line G2($m$+1) to a scan line G2($2m$) on the basis of the signal GCLK, the signal PWC1, the signal PWC2, and the like.

Thus, for example, the driver circuit GDB can supply a selection signal without supply of selection signals from the driver circuit GDA and the driver circuit GDC. Alternatively, the display of the region where a selection signal is supplied from the driver circuit GDB can be refreshed without any change in the display of regions where selection signals are supplied from the driver circuit GDA and the driver circuit GDC. Alternatively, power consumed by the driver circuits can be reduced.

[Eighth Step]

In the eighth step, the interrupt processing terminates (see FIG. 14(A)(U8)). Note that in a period in which the main processing is executed, the interrupt processing may be repeatedly executed.

<<Predetermined Event>>

For example, it is possible to use events supplied using a pointing device such as a mouse, such as "click" and "drag", and events supplied to a touch panel with a finger or the like used as a pointer, such as "tap", "drag", and "swipe".

For example, the position of a slide bar pointed by a pointer, the swipe speed, and the drag speed can be used to assign arguments to an instruction associated with a predetermined event.

For example, data sensed by the sensing portion 250 is compared with a predetermined threshold value, and the compared results can be used for the event.

Specifically, a pressure sensor or the like in contact with a button or the like that is arranged so as to be pushed in a housing can be used for the sensing portion 250.

<<Instruction Associated with Predetermined Event>>

For example, the termination instruction can be associated with a predetermined event.

For example, "page-turning instruction" for switching display from one displayed image data to another image data can be associated with a predetermined event. Note that an argument determining the page-turning speed or the like, which is used when the "page-turning instruction" is executed, can be supplied using the predetermined event.

For example, "scroll instruction" for moving the display position of displayed part of image data and displaying another part continuing from that part, or the like can be associated with a predetermined event. Note that an argument determining the moving speed of display, or the like, which is used when the "scroll instruction" is executed, can be supplied using the predetermined event.

For example, an instruction for setting the display method, an instruction for generating image data, or the like can be associated with a predetermined event. Note that an argument determining the brightness of a generated image can be associated with a predetermined event. An argument determining the brightness of a generated image may be determined on the basis of ambient brightness sensed by the sensing portion 250.

For example, an instruction for acquiring data distributed via a push service using the communication portion 290 or the like can be associated with a predetermined event.

Note that positional data sensed by the sensing portion 250 may be used for the determination of the presence or absence of a qualification for acquiring data. Specifically, it may be determined that there is a qualification for acquiring data in the case of presence in a predetermined class room, school, conference room, company, building, or the like or in a predetermined region. Thus, for example, educational materials distributed in a classroom of a school, a university, or the like can be received, so that the data processing device 200 can be used as a schoolbook or the like (see FIG. 12(C)). Alternatively, materials distributed in a conference room in, for example, a company can be received and used for a conference material.

Note that this embodiment can be combined with other embodiments in this specification as appropriate.

Embodiment 6

In this embodiment, a structure of a data processing device of one embodiment of the present invention will be described with reference to FIG. 15 to FIG. 17.

Figure 15A:
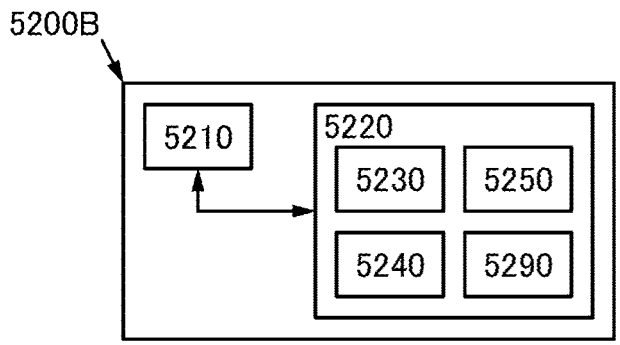
FIG. 15 (A) to (E) Diagrams illustrating structures of a data processing device of an embodiment.
Figure 15B:
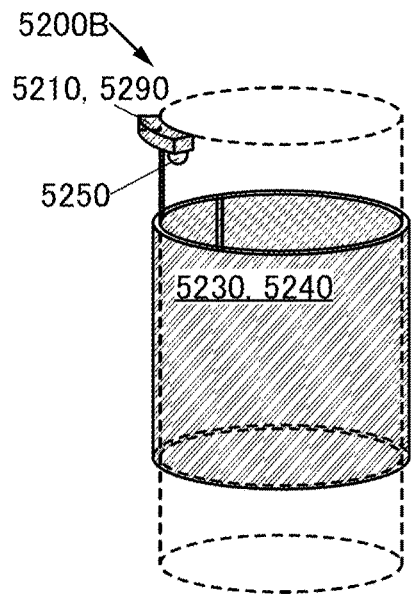
Figure 15C:
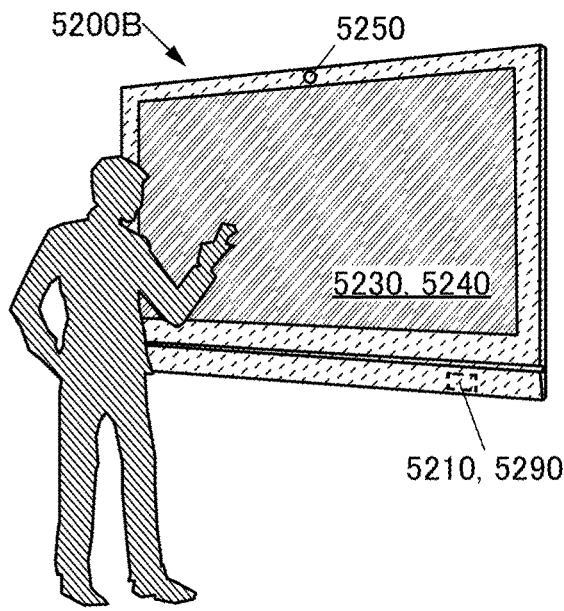
Figure 15D:
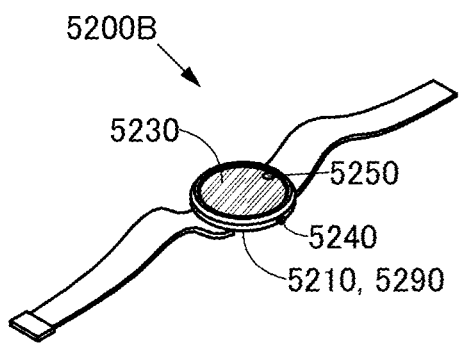
Figure 15E:
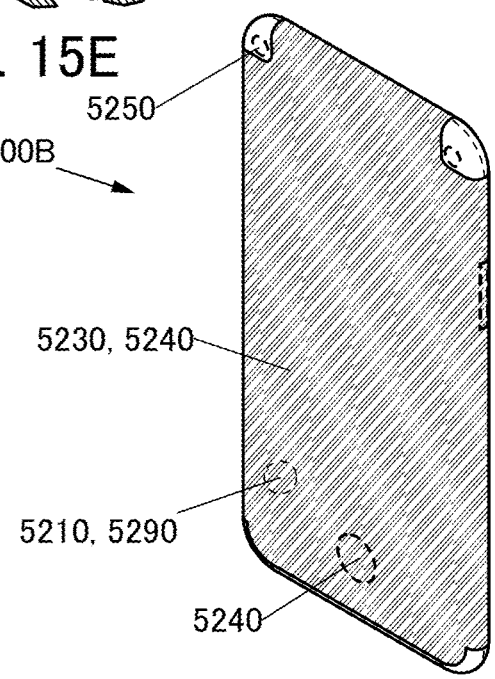
Figure 16A:
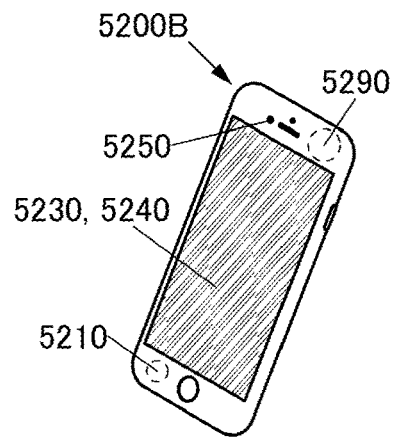
FIG. 16 (A) to (E) Diagrams illustrating structures of a data processing device of an embodiment.
Figure 16B:
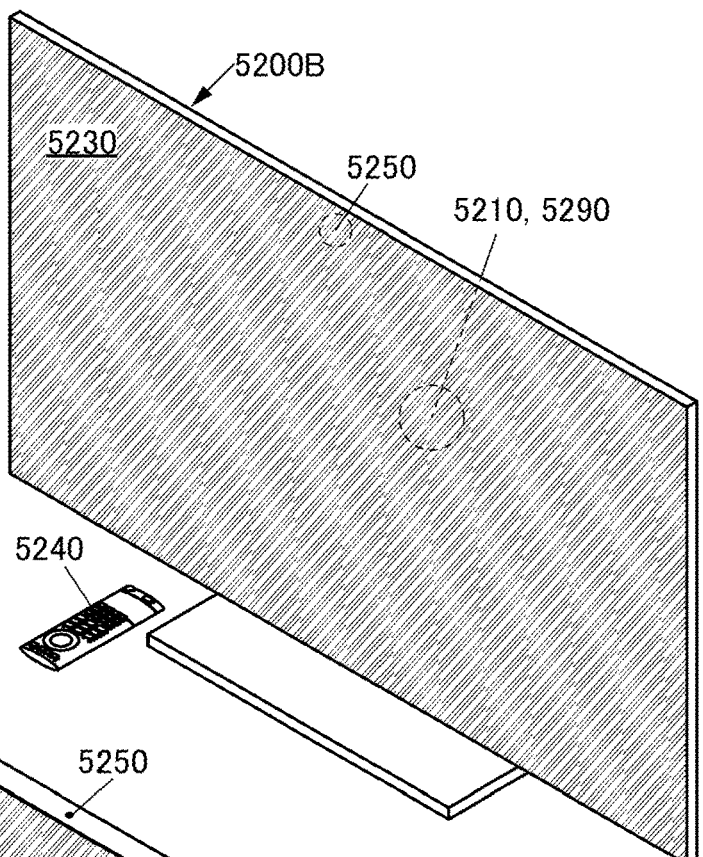
Figure 16C:
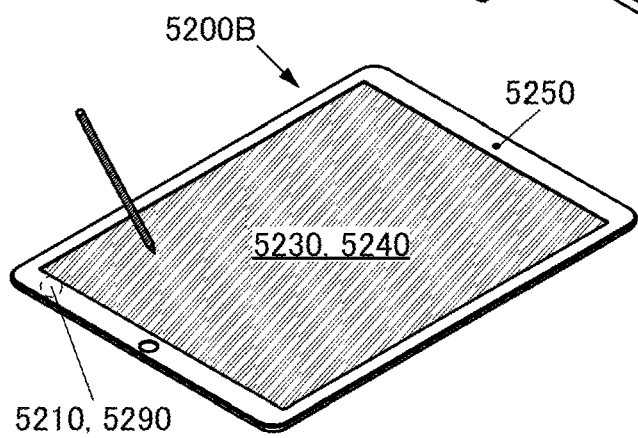
Figure 16D:
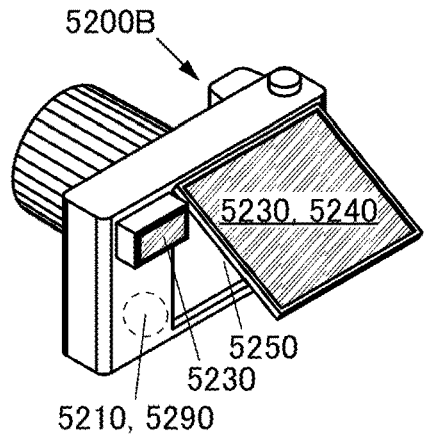
Figure 16E:
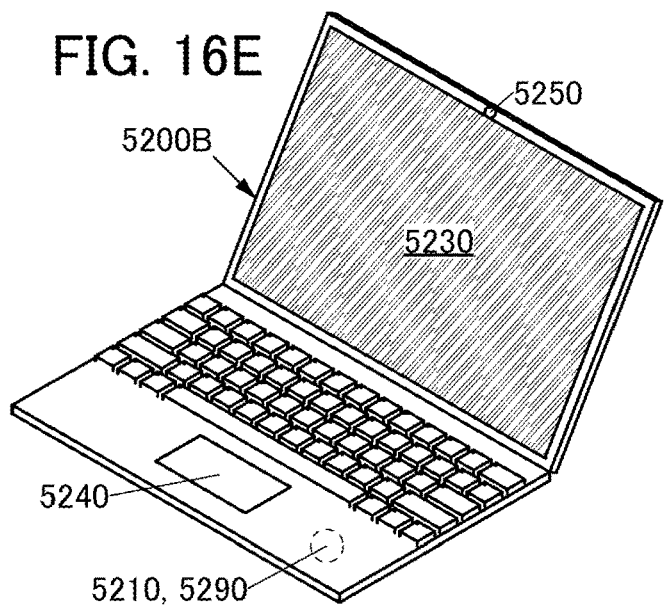
Figure 17A:
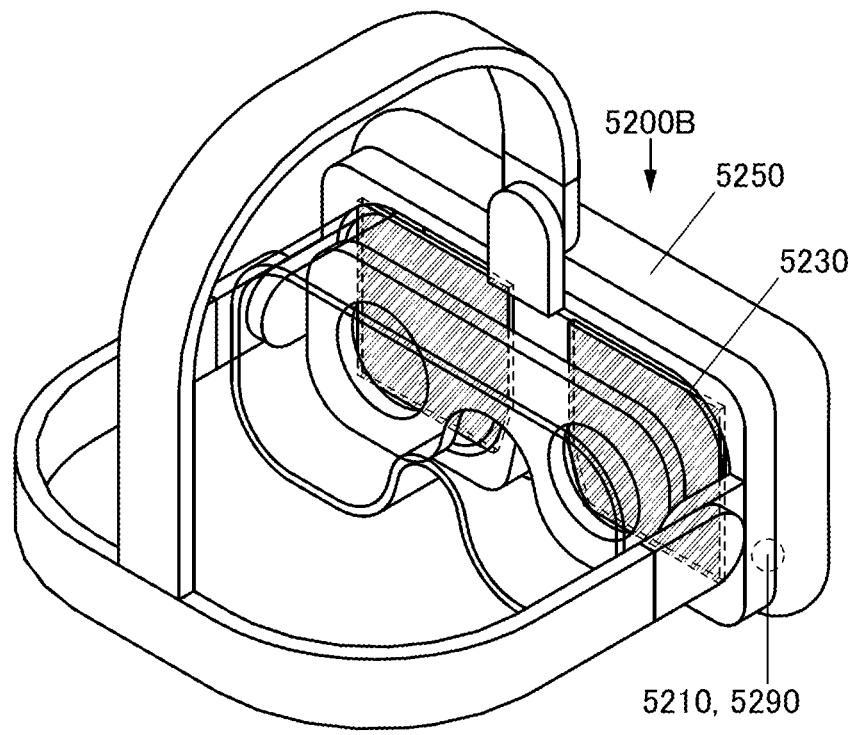
FIGS. 17 (A) and (B) Diagrams illustrating structures of a data processing device of an embodiment.
Figure 17B:
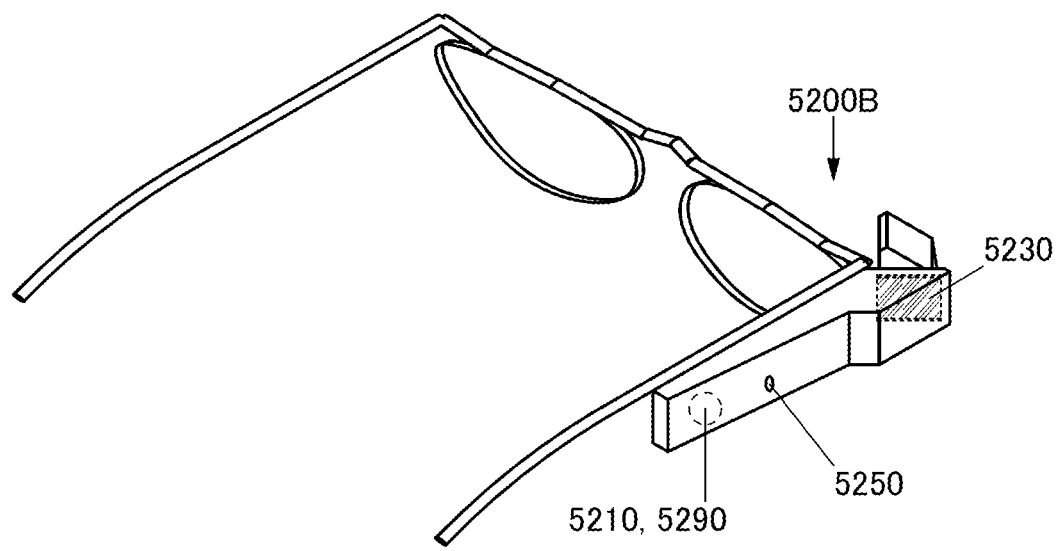

FIG. 15 to FIG. 17 are diagrams illustrating structures of the data processing device of one embodiment of the present invention. FIG. 15(A) is a block diagram of the data processing device, and FIG. 15(B) to FIG. 15(E) are perspective views illustrating structures of the data processing device. In addition, FIG. 16(A) to FIG. 16(E) are perspective views illustrating structures of the data processing device. In addition, FIG. 17(A) and FIG. 17(B) are perspective views illustrating structures of the data processing device.

<Data Processing Device>

A data processing device 5200B described in this embodiment includes an arithmetic device 5210 and an input/output device 5220 (see FIG. 15(A)).

The arithmetic device 5210 has a function of being supplied with operation data and a function of supplying image data on the basis of the operation data.

The input/output device 5220 includes a display portion 5230, an input portion 5240, a sensing portion 5250, and a communication portion 5290 and has a function of supplying operation data and a function of being supplied with image data. The input/output device 5220 also has a function of supplying sensing data, a function of supplying communication data, and a function of being supplied with communication data.

The input portion 5240 has a function of supplying operation data. For example, the input portion 5240 supplies operation data on the basis of operation by a user of the data processing device 5200B.

Specifically, a keyboard, a hardware button, a pointing device, a touch sensor, an illuminance sensor, an imaging device, an audio input device, an eye-gaze input device, an attitude detection device, or the like can be used as the input portion 5240.

The display portion 5230 includes a display panel and has a function of displaying image data. For example, the display panel described in Embodiment 1 or Embodiment 2 can be used for the display portion 5230.

The sensing portion 5250 has a function of supplying sensing data. For example, the sensing portion 5250 has a function of sensing a surrounding environment where the data processing device is used and supplying sensing data.

Specifically, an illuminance sensor, an imaging device, an attitude detection device, a pressure sensor, a human motion sensor, or the like can be used as the sensing portion 5250.

The communication portion 5290 has a function of being supplied with communication data and a function of supplying communication data. For example, the communication portion 5290 has a function of being connected to another electronic device or a communication network through wireless communication or wired communication. Specifically, the communication portion 5290 has a function of wireless local area network communication, telephone communication, near field communication, or the like.

<<Structure Example 1 of Data Processing Device>>

For example, the display portion 5230 can have an outer shape along a cylindrical column or the like (see FIG. 15(B)). In addition, the data processing device has a function of changing its display method in accordance with the illuminance of a usage environment. Furthermore, the data processing device has a function of changing displayed content in response to sensed existence of a person. This allows the data processing device to be provided on a column of a building, for example. The data processing device can display advertising, guidance, or the like. The data processing device can be used for digital signage or the like.

<<Structure Example 2 of Data Processing Device>>

For example, the data processing device has a function of generating image data on the basis of the path of a pointer used by a user (see FIG. 15(C)). Specifically, the display panel with a diagonal size of 20 inches or longer, preferably 40 inches or longer, further preferably 55 inches or longer can be used. Alternatively, a plurality of display panels can be arranged and used as one display region. Alternatively, a plurality of display panels can be arranged and used as a multiscreen. Thus, the data processing device can be used for an electronic blackboard, an electronic bulletin board, digital signage, or the like, for example.

<<Structure Example 3 of Data Processing Device>>

The data processing device can receive data from another device, and the data can be displayed on the display portion 5230 (see FIG. 15(D)). Several options can be displayed. The user can choose some from the options and send a reply to a transmitter of the data. For example, the data processing device has a function of changing its display method in accordance with the illuminance of a usage environment. Thus, for example, the power consumption of a smartwatch can be reduced. Alternatively, for example, a smartwatch can display an image so as to be suitably used even in an environment under strong external light, e.g., outdoors in fine weather.

<<Structure Example 4 of Data Processing Device>>

For example, the display portion 5230 has a surface gently curved along a side surface of a housing (see FIG. 15(E)). The display portion 5230 includes a display panel, and the display panel has a function of performing display on the front surface, the side surfaces, the top surface, and the rear surface, for example. Thus, for example, a mobile phone can display data not only on its front surface but also on its side surfaces, its top surface, and its rear surface.

<<Structure Example 5 of Data Processing Device>>

For example, the data processing device can receive data via the Internet and display the data on the display portion 5230 (see FIG. 16(A)). A created message can be checked on the display portion 5230. The created message can be sent to another device. For example, the data processing device has a function of changing its display method in accordance with the illuminance of a usage environment. Thus, the power consumption of a smartphone can be reduced. Alternatively, for example, a smartphone can display an image so as to be suitably used even in an environment under strong external light, e.g., outdoors in fine weather.

<<Structure Example 6 of Data Processing Device>>

A remote controller can be used as the input portion 5240 (see FIG. 16(B)). For example, the data processing device can receive data from a broadcast station or via the Internet and display the data on the display portion 5230. An image of a user can be captured using the sensing portion 5250. The image of the user can be transmitted. The data processing device can acquire a viewing history of the user and provide it to a cloud service. The data processing device can acquire recommendation data from a cloud service and display the data on the display portion 5230. A program or a moving image can be displayed on the basis of the recommendation data. For example, the data processing device has a function of changing its display method in accordance with the illuminance of a usage environment. Accordingly, for example, a television system can display an image to be suitably used even when irradiated with strong external light that enters a room in fine weather.

<<Structure Example 7 of Data Processing Device>>

For example, the data processing device can receive educational materials via the Internet and display them on the display portion 5230 (see FIG. 16(C)). An assignment can be input with the input portion 5240 and sent via the Internet. A corrected assignment or the evaluation of the assignment can be obtained from a cloud service and displayed on the display portion 5230. Suitable educational materials can be selected on the basis of the evaluation and displayed.

For example, the display portion 5230 can perform display using an image signal received from another data processing device. When the data processing device is placed on a stand or the like, the display portion 5230 can be used as a sub-display. Thus, for example, a tablet computer can display an image to be suitably used even in an environment under strong external light, e.g., outdoors in fine weather.

<<Structure Example 8 of Data Processing Device>>

The data processing device includes, for example, a plurality of display portions 5230 (see FIG. 16(D)). For example, the display portion 5230 can display an image that the sensing portion 5250 is capturing. A captured image can be displayed on the sensing portion. A captured image can be decorated using the input portion 5240. A message can be attached to a captured image. A captured image can be transmitted via the Internet. The data processing device has a function of changing its shooting conditions in accordance with the illuminance of a usage environment. Accordingly, for example, a digital camera can display a subject in such a manner that an image is favorably viewed even in an environment under strong external light, e.g., outdoors in fine weather.

<<Structure Example 9 of Data Processing Device>>

For example, the data processing device of this embodiment is used as a master and another data processing device is used as a slave, whereby the other data processing device can be controlled (see FIG. 16(E)). As another example, part of image data can be displayed on the display portion 5230 and another part of the image data can be displayed on a display portion of another data processing device. Image signals can be supplied. With the communication portion 5290, data to be written can be obtained from an input portion of another data processing device. Thus, a large display region can be utilized by using a portable personal computer, for example.

<<Structure Example 10 of Data Processing Device>>

The data processing device includes, for example, the sensing portion 5250 that senses an acceleration or a direction (see FIG. 17(A)). The sensing portion 5250 can supply data on the position of the user or the direction in which the user faces. The data processing device can generate image data for the right eye and image data for the left eye in accordance with the position of the user or the direction in which the user faces. The display portion 5230 includes a display region for the right eye and a display region for the left eye. Thus, a virtual reality image that gives the user a sense of immersion can be displayed on a goggles-type data processing device, for example.

<<Structure Example 11 of Data Processing Device>>

The data processing device includes, for example, an imaging device and the sensing portion 5250 that senses an acceleration or a direction (see FIG. 17(B)). The sensing portion 5250 can supply data on the position of the user or the direction in which the user faces. The data processing device can generate image data in accordance with the position of the user or the direction in which the user faces. Accordingly, the data can be shown together with a real-world scene, for example. An augmented reality image can be displayed on a glasses-type data processing device.

Note that this embodiment can be combined with other embodiments in this specification as appropriate.

In the case where there is an explicit description, X and Y are connected, in this specification and the like, for example, the case where X and Y are electrically connected, the case where X and Y are functionally connected, and the case where X and Y are directly connected are disclosed in this specification and the like. Accordingly, without being limited to a predetermined connection relationship, for example, a connection relationship shown in drawings or texts, a connection relationship other than one shown in drawings or texts is regarded as being disclosed in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y (e.g., a switch, a transistor, a capacitor, an inductor, a resistor, a diode, a display element, a light-emitting element, and a load) provided therebetween.

For example, in the case where X and Y are electrically connected, one or more elements that allow an electrical connection between X and Y (e.g., a switch, a transistor, a capacitor, an inductor, a resistor, a diode, a display element, a light-emitting element, and a load) can be connected between X and Y. Note that a switch has a function of being controlled to be turned on or off. That is, a switch has a function of being in a conduction state (on state) or a non-conduction state (off state) to control whether or not current flows. Alternatively, the switch has a function of selecting and changing a current path. Note that the case where X and Y are electrically connected includes the case where X and Y are directly connected.

An example of the case where X and Y are functionally connected is the case where one or more circuits that allow functional connection between X and Y (for example, a logic circuit (an inverter, a NAND circuit, a NOR circuit, or the like), a signal converter circuit (a DA converter circuit, an AD converter circuit, a gamma correction circuit, or the like), a potential level converter circuit (a power supply circuit (for example, a step-up circuit, a step-down circuit, or the like), a level shifter circuit for changing the potential level of a signal, or the like), a voltage source, a current source, a switching circuit, an amplifier circuit (a circuit capable of increasing signal amplitude, the amount of current, or the like, an operational amplifier, a differential amplifier circuit, a source follower circuit, a buffer circuit, or the like), a signal generator circuit, a memory circuit, a control circuit, or the like) can be connected between X and Y. For example, even when another circuit is interposed between X and Y, X and Y are functionally connected when a signal output from X is transmitted to Y. Note that the case where X and Y are functionally connected includes the case where X and Y are directly connected and the case where X and Y are electrically connected.

Note that in the case where there is an explicit description, X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are disclosed in this specification and the like. That is, in the case where there is an explicit description, being electrically connected, the same contents as the case where there is only an explicit description, being connected, are disclosed in this specification and the like.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y can be expressed as follows.

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, the expression "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order" can be used. Alternatively, the expression "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order" can be used. When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path through the transistor and between the source (or the first terminal or the like) of the transistor and a drain (or a second terminal or the like) of the transistor, the first connection path is a path through Z1, the drain (or the second terminal or the like) of the transistor is electrically connected to Y through at least a third connection path, the third connection path does not include the second connection path, and the third connection path is a path through Z2" and "a source (or a first terminal or the like) of a transistor is electrically connected to X through Z1 by at least a first connection path, the first connection path does not include a second connection path, the second connection path includes a connection path through the transistor, a drain (or a second terminal or the like) of the transistor is electrically connected to Y through Z2 by at least a third connection path, and the third connection path does not include the second connection path". Alternatively, the expression "a source (or a first terminal or the like) of a transistor is electrically connected to X by at least a first electrical path through Z1, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y by at least a third electrical path through Z2, the third electrical path does not include a fourth electrical path, and the fourth electrical path is an electrical path from the drain (or the second terminal or the like) of the transistor to the source (or the first terminal or the like) of the transistor" can be used. When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and the expression is not limited to these expressions. Here, X, Y, Z1, and Z2 denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, "electrical connection" in this specification includes in its category such a case where one conductive film has functions of a plurality of components.

REFERENCE NUMERALS

ACF1: conductive material, ANO: conductive film, C21: capacitor, C22: capacitor, CI: control data, CP: conductive material, DS: sensing data, GCLK: signal, G1($i$): scan line, II: input data, IND: index image, KB1: structure body, NP: navigation panel, N1($i,j$): node, P1: positional data, PWC1: signal, PW2: signal, S1($j$): signal line, SP: control signal, SW21: switch, SW22: switch, TN: thumbnail image, VI: image data, V11: data, VCOM2: conductive film, 200: data processing device, 210: arithmetic device, 211: arithmetic portion, 212: memory portion, 213: artificial intelligence portion, 214: transmission path, 215: input/output interface, 220: input/output device, 230: display portion, 231: display region, 233: control circuit, 234: decompression circuit, 235: image processing circuit, 238: control portion, 240: input portion, 241: sensing region, 248: control portion, 249: component, 250: sensing portion, 290: communication portion, 501C: insulating film, 501D: insulating film, 504: conductive film, 506: insulating film, 508: semiconductor film, 508A: region, 508B: region, 508C: region, 510: base material, 512A: conductive film, 512B: conductive film, 516: insulating film, 518: insulating film, 519B: terminal, 520: functional layer, 521: insulating film, 524: conductive film, 528: insulating film, 530(0: pixel circuit, 550($i,j$): display element, 551($i,j$): electrode, 552: electrode, 553: layer containing a light-emitting material, 554($i,j$): reflective film, 555: adjustment layer, 573: insulating film, 573A: insulating film, 573B: insulating film, 591A: opening portion, 700: display panel, 700TP: input/output panel, 702(*i,j*): pixel, 703(*i,k*): pixel, 705: sealant, 720: functional layer, 770: base material, 770P: functional film, 775(*g,h*): sensing element, 5200B: data processing device, 5210: arithmetic device, 5220: input/output device, 5230: display portion, 5240: input portion, 5250: sensing portion, 5290: communication portion This application is based on Japanese Patent Application Serial No. 2018-123979 filed with Japan Patent Office on Jun. 29, 2018, the entire contents of which are hereby incorporated herein by reference.

The invention claimed is:

1. A display panel comprising:
a display region,
wherein the display region comprises a first pixel, a second pixel, a third pixel and a filter,
wherein the first pixel is configured to emit light with a spectrum including a local maximum at a first wavelength,
wherein the second pixel is configured to emit light with a spectrum including a local maximum at a second wavelength,
wherein the third pixel is configured to emit light with a spectrum including a local maximum at a third wavelength,
wherein the filter comprises a first region, a second region and a third region,
wherein the first region and the first pixel overlap each other,
wherein the second region and the second pixel overlap each other,
wherein the third region and the third pixel overlap each other,
wherein the first region, the second region and the third region have the same transmittance spectrum,
wherein the transmittance spectrum has local minimums at a fourth wavelength and a fifth wavelength,
wherein the second wavelength is longer than the first wavelength,
wherein the third wavelength is longer than the second wavelength,
wherein the fourth wavelength is between the first wavelength and the second wavelength, and
wherein the fifth wavelength is between the second wavelength and the third wavelength.

2. The display panel according to claim 1,
wherein the filter has a transmittance lower than or equal to 0.5 in a wavelength band having a width of 20 nm including the fourth wavelength,
wherein the filter has a transmittance lower than or equal to 0.5 in a wavelength band having a width of 30 nm including the fifth wavelength, and
wherein the filter is a multilayer film.

3. The display panel according to claim 1,
wherein the first pixel comprises a light-emitting element having a microcavity structure,
wherein the microcavity structure comprises a first reflective film and a second reflective film,
wherein the first reflective film and the second reflective film overlap each other, and
wherein the light-emitting element comprises a first electrode, a second electrode, and a light-emitting layer between the first electrode and the second electrode.

4. The display panel according to claim 3,
wherein the second pixel comprises the light-emitting layer and a first adjustment layer,
wherein the third pixel comprises the light-emitting layer and a second adjustment layer, and
wherein the second adjustment layer has a longer optical distance than the first adjustment layer.

5. The display panel according to claim 1,
wherein the display region comprises a first group of pixels, a second group of pixels, a scan line and a signal line,
wherein the first group of pixels are arranged in a row direction,
wherein the first pixel is included in the first group of pixels,
wherein the second group of pixels are arranged in a column direction intersecting the row direction,
wherein the second group of pixels comprises the first pixel is included in the second group of pixels,
wherein the scan line is electrically connected to the first group of pixels, and
wherein the signal line is electrically connected to the second group of pixels.

6. The display panel according to claim 1,
wherein the display region comprises 2000 or more pixels per inch, and
wherein the first pixel is included in the 2000 or more pixels.

7. A display device comprising:
the display panel according to claim 1; and
a control portion,
wherein the control portion is supplied with image data and control data,
wherein the control portion generates data on the basis of the image data,
wherein the control portion generates a control signal on the basis of the control data,
wherein the control portion supplies the data and the control signal,
wherein the display panel is supplied with the data and the control signal, and
wherein each of the first pixel, the second pixel and the third pixel performs display on the basis of the data.

8. An input/output device comprising:
an input portion and a display portion,
wherein the display portion comprises the display panel according to claim 1,
wherein the input portion comprises a sensing region,
wherein the input portion senses an object approaching the sensing region, and
wherein the sensing region comprises a region overlapping with the first pixel.

9. A data processing device comprising:
an arithmetic device and an input/output device,
wherein the arithmetic device is supplied with input data or sensing data,
wherein the arithmetic device generates control data and image data on the basis of the input data or the sensing data,
wherein the arithmetic device supplies the control data and the image data,
wherein the input/output device supplies the input data and the sensing data,
wherein the input/output device is supplied with the control data and the image data,
wherein the input/output device comprises a display portion, an input portion, and a sensing portion,
wherein the display portion comprises the display panel according to claim 1, wherein the display portion displays the image data on the basis of the control data, wherein the input portion generates the input data, and wherein the sensing portion generates the sensing data.

10. A data processing device comprising one or more of a keyboard, a hardware button, a pointing device, a touch sensor, an illuminance sensor, an imaging device, an audio input device, an eye-gaze input device, and an attitude detection device, and the display panel according to claim 1.

* * * * *